(12) United States Patent
Jung

(10) Patent No.: US 11,798,648 B2
(45) Date of Patent: Oct. 24, 2023

(54) APPARATUS AND METHOD FOR RECOVERING DATA IN A MEMORY SYSTEM

(71) Applicant: SK hynix Inc., Gyeonggi-do (KR)

(72) Inventor: In Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/828,480

(22) Filed: May 31, 2022

(65) Prior Publication Data

US 2023/0140746 A1    May 4, 2023

(30) Foreign Application Priority Data

Nov. 3, 2021 (KR) .................... 10-2021-0149701

(51) Int. Cl.
| | |
|---|---|
| *G11C 29/42* | (2006.01) |
| *G11C 16/26* | (2006.01) |
| *G11C 16/10* | (2006.01) |
| *G11C 29/44* | (2006.01) |

(52) U.S. Cl.
CPC .......... *G11C 29/42* (2013.01); *G11C 16/102* (2013.01); *G11C 16/26* (2013.01); *G11C 29/44* (2013.01)

(58) Field of Classification Search
None
See application file for complete search history.

(56) References Cited

U.S. PATENT DOCUMENTS

2010/0251075 A1* 9/2010 Takahashi ........... G06F 11/1068
714/E11.034

FOREIGN PATENT DOCUMENTS

KR    10-2017-0042433 A    4/2017

\* cited by examiner

*Primary Examiner* — Cynthia Britt
*Assistant Examiner* — Matthew W Wahlin
(74) *Attorney, Agent, or Firm* — IP & T GROUP LLP

(57) ABSTRACT

A memory system comprises a memory device including plural memory blocks, and a controller coupled to the memory device. The controller controls the memory device to read a first group including plural data items and a parity associated with the plural data items from first locations in the plural memory blocks. The controller generates a new parity when the plural data items and the parity include plural errors, substitute one of the plural errors with the new parity and another of the plural errors with dummy data. The controller controls the memory device to program a second group including the new parity and the dummy data in second locations in the plural memory blocks. The second locations are different from the first locations.

20 Claims, 13 Drawing Sheets

FIG. 6

| | | P0(Block 0) | | | | P1(Block 1) | | | | P2(Block 2) | | | | P3(Block 3) | | | |
|---|---|---|---|---|---|---|---|---|---|---|---|---|---|---|---|---|---|
| | | VPN OFF:0 | VPN OFF:1 | VPN OFF:2 | VPN OFF:3 | VPN OFF:0 | VPN OFF:1 | VPN OFF:2 | VPN OFF:3 | VPN OFF:0 | VPN OFF:1 | VPN OFF:2 | VPN OFF:3 | VPN OFF:0 | VPN OFF:1 | VPN OFF:2 | VPN OFF:3 |
| WL0 | L | D0 | D1 | D2 | D3 | D4 | D5 | D6 | D7 | D8 | D9 | D10 | D11 | D12 | D13 | D14 | D15 |
| | C | D16 | D17 | D18 | D19 | D20 | D21 | D22 | D23 | D24 | D25 | D26 | D27 | D28 | D29 | D30 | D31 |
| | M | D32 | D33 | D34 | D35 | D36 | D37 | D38 | D39 | D40 | D41 | D42 | D43 | D44 | D45 | D46 | D47 |
| WL1 | L | D48 | D49 | D50 | D51 | D52 | D53 | D54 | D55 | D56 | D57 | D58 | D59 | D60 | D61 | D62 | D63 |
| | C | D64 | D65 | D66 | D67 | D68 | D69 | D70 | D71 | D72 | D73 | D74 | D75 | D76 | D77 | D78 | D79 |
| | M | D80 | D81 | D82 | D83 | D84 | D85 | D86 | D87 | D88 | D89 | D90 | D91 | D92 | D93 | D94 | D95 |
| WL2 | L | D96 | D97 | D98 | D99 | D100 | D101 | D102 | D103 | D104 | D105 | D106 | D107 | D108 | D109 | D110 | D111 |
| | C | D112 | D113 | D114 | D115 | D116 | D117 | D118 | D119 | D120 | D121 | D122 | D123 | D124 | D125 | D126 | D127 |
| | M | D128 | D129 | D130 | D131 | D132 | D133 | D134 | D135 | D136 | D137 | D138 | D139 | D140 | D141 | D142 | D143 |
| WL3 | L | D144 | D145 | D146 | D147 | D148 | D149 | D150 | D151 | D152 | D153 | D154 | D155 | Parity0 | Parity1 | Parity2 | Parity3 |
| | C | D160 | D161 | D162 | D163 | D164 | D165 | D166 | D167 | D168 | D169 | D170 | D171 | Parity4 | Parity5 | Parity6 | Parity7 |
| | M | D176 | D177 | D178 | D179 | D180 | D181 | D182 | D183 | D184 | D185 | D186 | D187 | Parity8 | Parity9 | Parity10 | Parity11 |
| WL4 | L | D0 | D1 | D2 | D3 | D4 | D5 | D6 | D7 | D8 | D9 | D10 | D11 | D12 | D13 | D14 | D15 |
| | C | D16 | D17 | D18 | D19 | D20 | D21 | D22 | D23 | D24 | D25 | D26 | D27 | D28 | D29 | D30 | D31 |
| | M | D32 | D33 | D34 | D35 | D36 | D37 | D38 | D39 | D40 | D41 | D42 | D43 | D44 | D45 | D46 | D47 |
| WL5 | L | D48 | D49 | D50 | D51 | D52 | D53 | D54 | D55 | D56 | D57 | D58 | D59 | D60 | D61 | D62 | D63 |
| | C | D64 | D65 | D66 | D67 | D68 | D69 | D70 | D71 | D72 | D73 | D74 | D75 | D76 | D77 | D78 | D79 |
| | M | D80 | D81 | D82 | D83 | D84 | D85 | D86 | D87 | D88 | D89 | D90 | D91 | D92 | D93 | D94 | D95 |
| WL6 | L | D96 | D97 | D98 | D99 | D100 | D101 | D102 | D103 | D104 | D105 | D106 | D107 | D108 | D109 | D110 | D111 |
| | C | D112 | D113 | D114 | D115 | D116 | D117 | D118 | D119 | D120 | D121 | D122 | D123 | D124 | D125 | D126 | D127 |
| | M | D128 | D129 | D130 | D131 | D132 | D133 | D134 | D135 | D136 | D137 | D138 | D139 | D140 | D141 | D142 | D143 |
| WL7 | L | D144 | D145 | D146 | D147 | D148 | D149 | D150 | D151 | D152 | D153 | D154 | D155 | Parity0 | Parity1 | Parity2 | Parity3 |
| | C | D160 | D161 | D162 | D163 | D164 | D165 | D166 | D167 | D168 | D169 | D170 | D171 | Parity4 | Parity5 | Parity6 | Parity7 |
| | M | D176 | D177 | D178 | D179 | D180 | D181 | D182 | D183 | D184 | D185 | D186 | D187 | Parity8 | Parity9 | Parity10 | Parity11 |

P_Grp_0 spans P2(Block 2) and P3(Block 3); P_Grp_1 spans the corresponding WL4–WL7 portion.

FIG. 7

```
Parity0 = D0 XOR D4 XOR D8 XOR D12
         XOR D48 XOR D52 XOR D56 XOR D60
         XOR D96 XOR D100 XOR D104 XOR D108
         XOR D144 XOR D148 XOR D152

Parity1 = D1 XOR D5 XOR D9 XOR D13
         XOR D49 XOR D53 XOR D57 XOR D61
         XOR D97 XOR D101 XOR D105 XOR D109
         XOR D145 XOR D149 XOR D153

⋮

Parity11 = D35 XOR D39 XOR D43 XOR D47
          XOR D83 XOR D87 XOR D91 XOR D95
          XOR D131 XOR D135 XOR D139 XOR D143
          XOR D179 XOR D183 XOR D187
```

LPDP0 = LPD0 XOR LPD4 XOR LPD8 XOR LPD12 XOR LPD16 XOR LPD20 XOR LPD24 XOR LPD28 XOR LPD32 XOR LPD36 XOR LPD40 XOR LPD44 XOR LPD48 XOR LPD52 XOR LPD56

FIG. 10

| | | D0 | | | |
|---|---|---|---|---|---|
| | | P1(Block 1) | | | |
| | | 3 | 2 | 1 | 0 |
| WL0 | L | LPD7 | LPD6 | LPD5 | LPD4 |
| | C | | | | |
| | M | | | | |
| WL1 | L | LPD23 | LPD22 | LPD21 | LPD20 |
| | C | | | | |
| | M | | | | |
| WL2 | L | LPD39 | LPD38 | LPD37 | LPD36 |
| | C | | | | |
| | M | | | | |
| WL3 | L | LPD55 | LPD54 | LPD53 | LPD52 |
| | C | | | | |
| | M | | | | |

| Remapp Block | | D0,P1(Block 1001) | | | |
|---|---|---|---|---|---|
| | | 3 | 2 | 1 | 0 |
| WL0 | L | LPD7 | LPD6 | LPD5 | LPD4 |
| | C | | | | |
| | M | | | | |
| WL1 | L | LPD23 | LPD22 | LPD21 | LPD20 |
| | C | | | | |
| | M | | | | |
| WL2 | L | LPD39 | LPD38 | LPD37 | R_LPD36 |
| | C | | | | |
| | M | | | | |
| WL3 | L | LPD55 | LPD54 | LPD53 | LPD52 |
| | C | | | | |
| | M | | | | |

FIG. 11

| | | P0(Block 0) | | | | P1(Block 1) | | | | P2(Block 2) | | | | P3(Block 3) | | | |
|---|---|---|---|---|---|---|---|---|---|---|---|---|---|---|---|---|---|
| | | 3 | 2 | 1 | 0 | 3 | 2 | 1 | 0 | 3 | 2 | 1 | 0 | 3 | 2 | 1 | 0 |
| WL0 | L | LPD3 | LPD2 | LPD1 | LPD0 | LPD7 | LPD6 | LPD5 | LPD4 | LPD11 | LPD10 | LPD9 | LPD8 | LPD15 | LPD14 | LPD13 | LPD12 |
| | C | | | | | | | | | | | | | | | | |
| | M | | | | | | | | | | | | | | | | |
| WL1 | L | LPD19 | LPD18 | LPD17 | LPD16 | LPD23 | LPD22 | LPD21 | LPD20 | LPD27 | LPD26 | LPD25 | LPD24 | LPD31 | LPD30 | LPD29 | LPD28 |
| | C | | | | | | | | | | | | | | | | |
| | M | | | | | | | | | | | | | | | | |
| WL2 | L | LPD35 | LPD34 | LPD33 | LPD32 | LPD39 | LPD38 | LPD37 | LPD36 | LPD43 | LPD42 | LPD41 | LPD40 | LPD47 | LPD46 | LPD45 | LPD44 |
| | C | | | | | | | | | | | | | | | | |
| | M | | | | | | | | | | | | | | | | |
| WL3 | L | LPD51 | LPD50 | LPD49 | LPD48 | LPD55 | LPD54 | LPD53 | LPD52 | LPD59 | LPD58 | LPD57 | LPD56 | LPDP3 | LPDP2 | LPDP1 | LPDP0 |
| | C | | | | | | | | | | | | | | | | |
| | M | | | | | | | | | | | | | | | | |

LPDP0 = LPD0 XOR LPD4 XOR LPD8 XOR LPD12 XOR LPD16 XOR LPD20 XOR LPD24 XOR LPD28 XOR LPD32 XOR LPD36 XOR LPD40 XOR LPD44 XOR LPD48 XOR LPD52 XOR LPD56

FIG. 13

Remap Table

| DIE | BLOCK | V-DIE | V-BLOCK |
|---|---|---|---|
| D0 | 1000 | NO REMAP | NO REMAP |
| 0 | 1001 | 0 | 1 |
| 0 | 1002 | NO REMAP | NO REMAP |
| 0 | 1003 | NO REMAP | NO REMAP |
| 0 | 1004 | NO REMAP | NO REMAP |
| 0 | 1005 | NO REMAP | NO REMAP |
| 0 | 1006 | NO REMAP | NO REMAP |
| 0 | 1007 | NO REMAP | NO REMAP |

Remap Table

| DIE | BLOCK | V-DIE | V-BLOCK | C-Parity | P-Group | Index | E-List[0]/P | E-List[1]/P | E-List[2]/P | E-List[3]/P |
|---|---|---|---|---|---|---|---|---|---|---|
| 0 | 1000 | NO REMAP | NO REMAP | | | | | | | |
| 0 | 1001 | 0 | 1 | 1 | 0 | 100 | 8/0 | | | |
| 0 | 1002 | NO REMAP | NO REMAP | | | | | | | |
| 0 | 1003 | NO REMAP | NO REMAP | | | | | | | |
| 0 | 1004 | NO REMAP | NO REMAP | | | | | | | |
| 0 | 1005 | NO REMAP | NO REMAP | | | | | | | |
| 0 | 1006 | NO REMAP | NO REMAP | | | | | | | |
| 0 | 1007 | NO REMAP | NO REMAP | | | | | | | |

APPARATUS AND METHOD FOR RECOVERING DATA IN A MEMORY SYSTEM

CROSS-REFERENCE TO RELATED APPLICATIONS

This patent application claims the benefit of Korean Patent Application No. 10-2021-0149701, filed on Nov. 3, 2021, the entire disclosure of which is incorporated herein by reference.

TECHNICAL FIELD

One or more embodiments of the present disclosure described herein relate to a memory device, a memory system, and an operation method thereof, and more particularly, to an apparatus and a method for recovering data stored in the memory device.

BACKGROUND

A data processing system includes a memory system or a data storage device. The data processing system can be developed to store more voluminous data in the data storage device, store data in the data storage device faster, and read data stored in the data storage device faster. The memory system or the data storage device can include non-volatile memory cells and/or volatile memory cells for storing data.

BRIEF DESCRIPTION OF THE DRAWINGS

The description herein makes reference to the accompanying drawings wherein like reference numerals refer to like parts throughout the figures.

FIG. 6 illustrates a data group programmed in the memory device according to embodiments of the present disclosure.

FIG. 7 illustrates a calculation for generating a parity included in the data group shown in FIG. 6 according to embodiments of the present disclosure.

FIG. 10 illustrates a data recovery operation in a situation shown in FIG. 9 according to embodiments of the present disclosure.

FIG. 11 illustrates how to operate the memory system when plural errors occur in the data group according to embodiments of the present disclosure.

FIG. 13 illustrates a change in a remap table storing a data recovery operation according to embodiments of the present disclosure.

DETAILED DESCRIPTION

Figure 1:
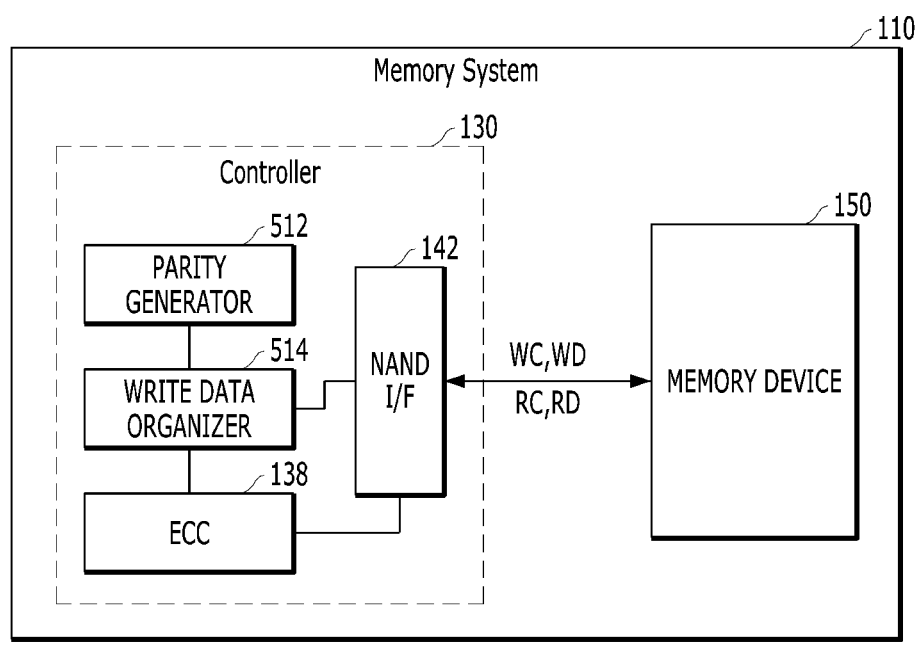
FIG. 1 illustrates a memory system according to an embodiment of the present disclosure.

Various embodiments of the present disclosure are described below with reference to the accompanying drawings. Elements and features of this disclosure may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. Furthermore, the terms in a claim do not foreclose the apparatus from including additional components, e.g., an interface unit, circuitry, etc.

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational, e.g., is not turned on nor activated. The block/unit/circuit/component used with the "configured to" language include hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

An embodiment of the present disclosure may provide a memory system, a data processing system, and an operation process or a method, which may quickly and reliably process data into a memory device by reducing operational complexity and performance degradation of the memory system, thereby enhancing usage efficiency of the memory device.

In an embodiment, a memory system can include a memory device including plural memory blocks; and a controller coupled to the memory device and configured to: control the memory device to read a first group including plural data items and a parity associated with the plural data items from first locations in the plural memory blocks; generate a new parity when the plural data items and the parity include plural errors; substitute one of the plural errors with the new parity and another of the plural errors with dummy data; and control the memory device to program a second group including the new parity, and the dummy data in second locations in the plural memory blocks, wherein the second locations are different from the first locations.

The controller can be configured to control the memory device to read the first group, receive first read data items included in the first group from the memory device for a first read operation, and check whether the first read data items include an uncorrectable ECC (UECC) error.

The controller can be further configured to receive the plural data items excluding the first read data items and the parity associated with the plural data items from the memory device for a second read operation when the first read data items include the uncorrectable ECC (UECC) error, and check whether the plural data excluding the first read data and the parity include another uncorrectable ECC (UECC) error.

The controller can be configured to generate, when at least two among the plural data items and the parity included in the first group include the uncorrectable ECC (UECC) error, the new parity based on the plural data items and the parity without the uncorrectable ECC (UECC) error included in the first group. The controller can be configured to substitute one of the at least two with the new parity and another of the at least two with dummy data.

The controller can be further configured to recover, when the plural data items excluding the first read data items and the parity obtained through the second read operation include no uncorrectable ECC (UECC) error, the first read data items based on the plural data items excluding the first read data and the parity associated with the plural data items.

The controller can be further configured to upmap, when the parity associated with the plural data items includes an uncorrectable ECC (UECC) error, the parity from the first group.

The first locations and the second locations can be included in different memory blocks.

The second locations can be selected from a free memory block included in the memory device.

The first group can include 15 data items and a single parity associated with the 15 data items, and the 15 data items and the single parity are distributed over, and stored in, the plural memory blocks.

The single parity can be calculated by an exclusive OR (XOR) operation to the 15 data items.

The controller can control the memory device to read the first group for a garbage collection operation, a wear levelling operation, or a read retry operation.

In an embodiment, a method for operating a memory system can include controlling a memory device including plural memory blocks to read a first group including plural data items and a parity associated with the plural data items from first locations in the plural memory blocks; generating a new parity when the plural data items and the parity include plural errors; substituting one of the plural errors with the new parity and another of the plural errors with dummy data; and controlling the memory device to program a second group including the new parity, and the dummy data in second locations in the plural memory blocks, wherein the second locations are different from the first locations.

The controlling the memory device to read the first group can include receiving first read data items included in the first group from the memory device for a first read operation; and checking whether the first read data items includes an uncorrectable ECC (UECC) error.

The controlling the memory device to read the first group can further include receiving the plural data items excluding the first read data items and the parity associated with the plural data items from the memory device for a second read operation; and checking whether the plural data items excluding the first read data items and the parity include another uncorrectable ECC (UECC) error.

When at least two of the plural data items and the parity included in the first group include the uncorrectable ECC (UECC) error, the new parity can be generated based on the plural data items and the parity without the uncorrectable ECC (UECC) errors included in the first group. One of the at least two can be substituted with the new parity, and another of the at least two can be substituted with dummy data.

The method can further include recovering the first read data items based on the plural data items excluding the first read data items and the parity associated with the plural data items when the plural data items excluding the first read data items and the parity obtained through the second read operation include no uncorrectable ECC (UECC) error.

The method can further include unmapping the parity associated with the plural data items from the first group when the parity includes an uncorrectable ECC (UECC) error.

The first group can include 15 data items and a single parity, and the 15 data items and the single parity associated with the 15 data items are distributed over, and stored in, the plural memory blocks. The single parity can be calculated by an exclusive OR (XOR) operation to the 15 data.

In another embodiment, a memory system can include a memory device including plural memory blocks; and a controller configured to: perform a read operation by controlling the memory device to read first read data items, receiving the first read data items from the memory device, and checking whether the first read data items include an uncorrectable ECC (UECC) error; perform an additional read operation, when the first read data items include the UECC error, by controlling the memory device to read plural data items and a parity associated with the first read data items, receiving the plural data items and the parity from the memory device, and checking whether one of the plural data and the parity includes another UECC error; generate a new parity when at least one of the plural data items and the parity includes the another UECC error; substitute the UECC error included in the first read data items with the new parity and the another UECC error included in the plural data and the parity with dummy data; and control the memory device to program the first read data items and the plural data items including the new parity and the dummy data in the plural memory blocks.

The controller can be further configured to recover the first read data items when the plural data items and the parity associated with the first read data items do not include an UECC error.

In another embodiment, a memory system can include a memory device configured to store therein at least an original data group including plural data bits and an original parity bit corresponding to the plural data bits, which are stored as having the same significance in multiple-level memory cells of the same offset within distributed pages in distributed blocks of distributed planes within the device; and a controller configured to: control the memory device to read page data in units of pages, control, when the page data has a first error-data bit, the memory device to read the original data group, to which the first error-data bit belongs, generate, when the original data group has a second error-data bit, a revised parity bit based on the data bits other than the first and second error-data bits within the data group while invalidating the original parity bit, replace the first error-data bit with the revised parity bit while replacing the second error-data bit with a dummy bit to generate a revised data group, control the memory device to store therein the revised data group, and record, as a reference for locating the bits belonging to the revised data group, a difference between the original and revised data groups.

Embodiments described herein provide an apparatus and a method for improving a data input/output operation of a memory system or a data processing system.

Embodiments will now be described with reference to the accompanying drawings, wherein like numbers reference like elements.

FIG. 1 illustrates a memory system according to an embodiment of the present disclosure. Referring to FIG. 1, the memory system 110 can include a controller 130 and a memory device 150. The memory device 150 can include a plurality of non-volatile memory cells capable of storing data transmitted from an external device, e.g., a host 102 shown in FIG. 2. The memory device 150 can output stored data upon a request from the host 102. The controller 130 can control data input/output operations performed within the memory device 150 and perform data communication with the host 102. Components included in the memory system 110 will be described later, referring to FIGS. 2 and 3.

Referring to FIG. 1, the memory system 110 can include the memory device 150 and the controller 130. The memory device 150 can include plural non-volatile memory cell regions. For example, each of the plural non-volatile memory cell regions can be considered a memory plane, a memory block, a page, or the like. For example, when the controller 130 delivers a write command WC and write data items WD into the memory device 150, the memory device 150 can program the write data items WD in a specific location in the plural non-volatile memory regions. Further, when the controller 130 delivers a read command RC and a data address, the memory device 150 can read data items RD at a location indicated by the data address and output the data RD to the controller 130.

The controller 130 can generate at least one data group including plural data items (e.g., write data items) to program data in the memory device 150. Also, to improve safety regarding the plural data items, a parity generator 512 in the controller 130 can generate a parity based on the plural data items included in the data group. A write data configuration unit 514 can configure a data group including the plural data items and the parity associated with the plural data items.

Further, when the write data configuration unit 514 configures a plurality of data groups, the memory interface 142 in the controller 130 can transmit the plurality of data groups to the memory device 150. The memory device 150 can program a plurality of data groups in a page group. Herein, the page group can include a plurality of pages distributed over a plurality of memory blocks included in the memory device 150. According to an embodiment, the page group can include a plurality of pages distributed over a plurality of planes of the memory device 150. To reduce a time spent on programming the data group including the plural data items and the parity in the memory device 150, the plurality of pages can be distributed in the memory device 150 so that the plural data items and the parity included in each data group can be programmed in parallel.

Accordingly, a non-volatile memory cell included in the memory device 150 can store a single bit data or a multi-bit data. For example, an operation of programming the multi-bit data can be performed in multi stages within the memory device 150 including a non-volatile memory cell capable of storing the multi-bit data. According to an embodiment, the memory system 110 can perform two-step or multi-step data programming operations to program the multi-bit data. In another embodiment, memory system 110 can perform foggy and fine data programming operations to program the multi-bit data. An operation performed by the memory device 150 for storing the multi-bit data in the non-volatile memory cell will be described later with reference to FIG. 6.

The parity generator 512 can perform a logical operation on the plural data items. When the parity generator 512 performs a complex logical operation for generating the parity for the plural data items, speed and performance of a program operation performed by the memory system 110 may be degraded. Accordingly, the parity generator 512 can be designed not to deteriorate the speed and the performance of the program operation. By way of example but not limitation, the parity generator 512 can generate a single parity by performing an exclusive-OR (XOR) operation on 15 data items.

The write data configuration unit 514 can configure a data group based on the plural data items and the parity to be programmed in the memory device 150. For example, the non-volatile memory cell in the memory device 150 can store 3-bit data (e.g., LSB data, CSB data, MSB data). One page including a plurality of non-volatile memory cells can include an LSB page, a CSB page, and an MSB page. The controller 130 can arrange the plural data items and parity to be distributed over and stored in a plurality of memory blocks or a plurality of planes. Then, the controller 130 can transmit the data group (e.g., the write data items WD) corresponding to an LSB page, a CSB page, and an MSB page to the memory device 150 based on a preset order or a program sequence. Herein, the preset order can vary according to multi-step programming and foggy-fine programming performed by the memory device 150. According to an embodiment, a size of the write data items WD transferred at one time can be different according to at least one of a size of a buffer or register included in the memory device 150 or the number of memory dies or memory planes included in the memory device 150.

Figure 2:
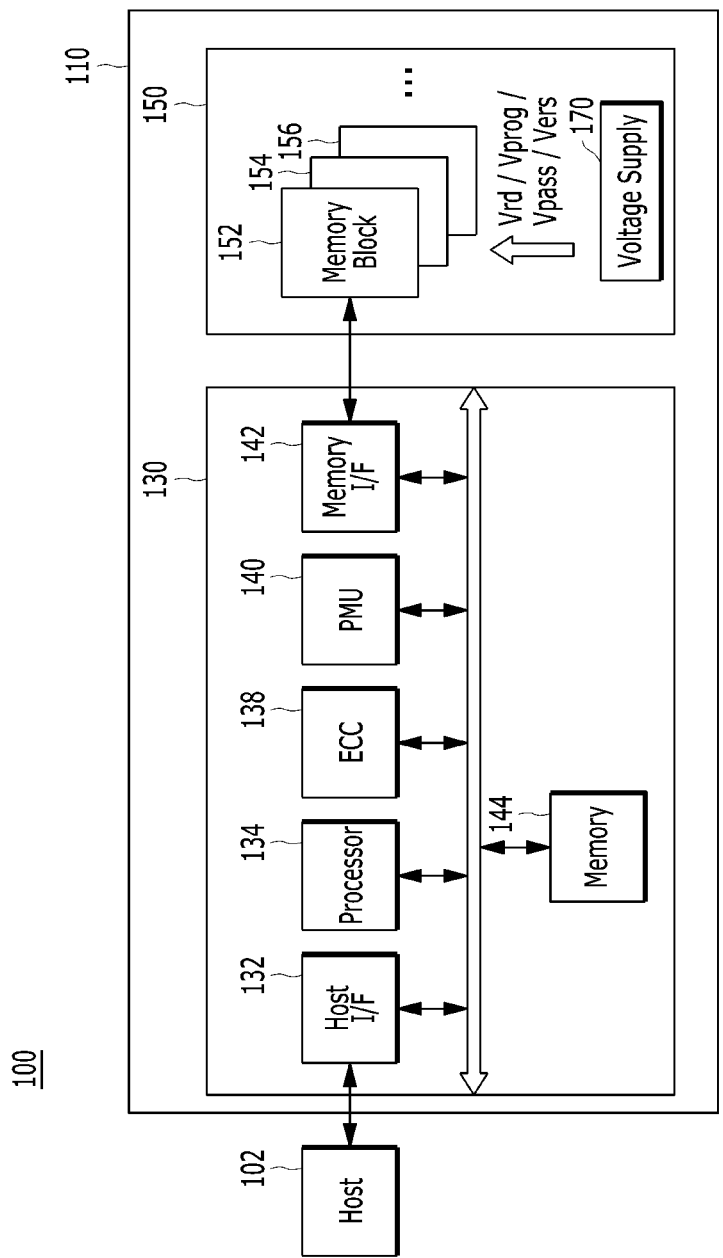
FIG. 2 illustrates a data processing system according to another embodiment of the present disclosure.

According to an embodiment, error correction circuitry (ECC) 138 shown in FIG. 2 can check whether an error is included in the read data items RD transmitted from the memory device 150, and cure or recover a detected error included in the read data items RD. The error correction circuitry (ECC) 138 can be designed to have data reliability required for the memory system 110 or an error correction capability corresponding to the performance of the memory device 150. For example, the error correction circuitry (ECC) can use or employ at least one of various error correction codes. Although it has been described that the parity generator 512 and the error correction circuitry (ECC) 138 included in the controller 130 shown in FIGS. 1 and 2 may be implemented as separated modules or circuits, the parity generator 512 and the error correction circuitry (ECC) 138 can be implemented as a single module or circuit according to an embodiment.

The memory system 110 can use chipkill decoding capable of restoring original data even if an error occurs in multiple bits of the original data or multiple errors of the plural data items. A process in which the memory system 110 generates a chipkill parity and recovers data can be performed by the error correction circuitry (ECC) 138 shown in FIG. 2. For example, the error correction circuitry (ECC) 138 described in FIG. 2 can perform the chipkill decoding. For example, through the chipkill decoding, the memory system 110 can recover and restore a portion of the first non-volatile cell region 522 based on other data stored in other regions even if the portion of the first non-volatile cell region 522 could not be restored autonomously.

When a read request is input from an external device (e.g., a host 102 shown in FIGS. 2 to 3), the memory system 110 may read data items RD corresponding to the read request from the memory device 150 and output read data items RD to the external device. If there is an error in the read data items RD to be transmitted from the external device in response to the read request, the error correction circuitry (ECC) 138 can repair the error and then the controller 130 can output the repaired read data items to the external device. The controller 130 can store the repaired read data items in another location within the memory device 150 for data safety. To reduce an additional write operation (e.g., Write Amplification Factor, WAF) in order to maintain or improve operating performance or lifespan of the memory system 110, the controller 130 does not program all of the read data items received from the page group to other locations, but program some, not all, of the read data items having the error into another memory block or a free block.

Moreover, data stored in the memory device 150 can be read even in an operation performed to improve operating performance of the memory system 110, regardless of a read request from the external device. For example, to perform garbage collection, the controller 130 can read data items from a specific location in the memory device 150 and then program the data in another location of the memory device 150. According to an embodiment, the controller 130 can check whether an error is included in the data transmitted to the memory device 150, and then repair or recover the error when the error is detected. In addition to the garbage collection, the controller 130 can read data items stored in the memory device 150 for wear leveling or read retry.

An error may occur in the process of reading data stored in the memory device 150. For example, the error may be an uncorrectable ECC (UECC) error. When the error occurs in the data, the controller 130 can perform an additional read operation to recover or restore the data including the error. Further, another error may additionally occur while an additional read operation is performed on a data group including a parity and plural data items associated with the data in which the error has occurred. In this case, the data group can include plural errors including an error occurring in the read operation and another error occurring in the additional read operation. When the plural errors occur in the data group, it might be difficult to recover the plural errors based on the parity only. For example, when a parity is generated by performing an exclusive-OR on 15 data items and an error occurs in a single data item, it is possible to recover the single data item including the error based on 14 other data items without an error and the parity. However, if errors occur in 2 data items out of 15 data items, the 2 data items could not be recovered based on 13 other data item and the parity. To recover plural data items with plural errors, an additional algorithm using a separate error correction code for recovering the plural errors or chipkill decoding can be used.

As mentioned above, when multiple errors occur in a data group, a parity may no longer be useful. In this case, the memory system 110 can unmap the parity that is no longer useful from the data group. That is, the parity may be excluded from the data group. In addition, the memory system 110 can calculate a new parity only with data in which no error has occurred and replace, with the new parity, an error checked in the read operation. Also, the memory system 110 can replace, with the dummy data, another error checked in the additional read operation. When plural errors occur in the data group obtained through the read operation and the additional read operation, the plural errors can be replaced with the new parity and the dummy data. Accordingly, the controller 130 can check and recover an additionally occurred error in the later process of reading the data group based on the new parity. In addition, the controller 130 can recognize a location of data in which an error has occurred in the data group including new parity and dummy data, thereby reducing resources spent on performing an algorithm for recovering the data with the plural errors (e.g., reducing the number of read operations to obtain soft decoding data from the memory device 150).

The memory system according to an embodiment of the present disclosure can perform an exclusive-OR (XOR) operation on plural data items to generate a parity associated with the plural data items and store the plural data items and the parity in a memory device 150. The controller 130 for controlling a data input/output operation of the memory device 150 can perform a read operation on at least one of the plural data items, and can check whether there is an error (e.g., UECC) in the at least some of the plural data items (e.g., read data items obtained through the read operation). When the at least one of the plural data items includes the error, the controller 130 can perform an additional read operation to secure other of the plural data items and the parity related to the at least one of the plural data items in which the error has occurred. When there is no other error in other data of the plural data items and the parity secured through the additional read operation, the controller 130 can perform an exclusive-OR (XOR) operation based on the other data and the parity having no errors to recover the at least one data in which the error occurred.

Moreover, when other errors occur in the secured plurality of data items and parity during an additional read operation, it is difficult to recover the plurality of errors through exclusive-OR (XOR) due to the plurality of errors. In this case, the controller 130 can generate a new parity by performing an exclusive-OR (XOR) only with no error data items among the plurality of data items and parity and may replace the error with the new parity. Further, the controller 130 can replace at least one another error with dummy data. The controller 130 can recognize the location of the error among the plural data items through the new parity and dummy data. When the corresponding data is read later, the controller 130 can recognize that the plural errors have occurred in the data group including the corresponding data. According to an embodiment, the controller 130 can perform an error correction code algorithm (e.g., chipkill decoding) to recover the data group including the plural errors.

When an error occurs in one data item among the plurality of data items, the memory system 110 can use the parity, which is calculated by performing the exclusive-OR operation on the plural data items associated with the corresponding data, to recover or restore the corresponding data in which the error occurred. When plural errors occur in two or more data among the plural data items, the memory system 110 can replace the two or more data items with errors with a new parity and dummy data. Accordingly, the memory system 110 can recognize which location the errors occur while the plural data items are used for data recovery or data restoration. Because the memory system 110 does not have to read some data repeatedly (e.g., the dummy data which corresponds to data including an error which has occurred) during the recovery operation, efficiency of the recovery operation can be improved.

Hereinafter, descriptions will be made focusing on operations or components that can be technically distinguished between the controller 130 and the memory device 150 described in FIG. 1 and FIGS. 2 to 4. Specifically, a flash translation layer (FTL) 240 in the controller 130 will be described in more detail with reference to FIGS. 3 to 4. According to an embodiment, roles and functions of the flash translation layer (FTL) in the controller 130 may be varied.

Figure 3:
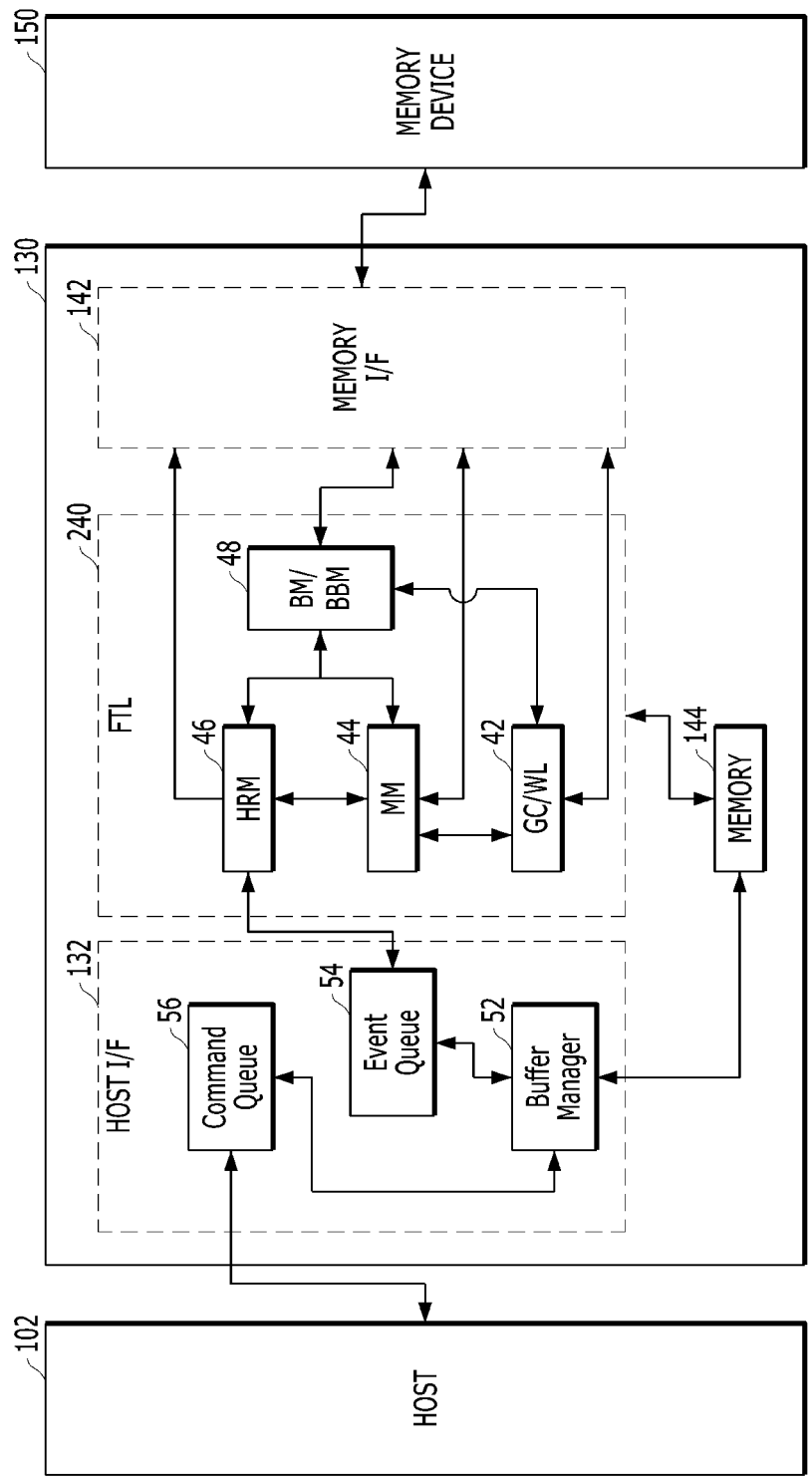
FIG. 3 illustrates a memory system according to another embodiment of the present disclosure.

FIGS. 2 and 3 illustrate some operations that may be performed by the memory system 110 according to one or more embodiments of the present disclosure.

Referring to FIG. 2, the data processing system 100 may include a host 102 engaged or coupled with a memory system, such as memory system 110. For example, the host 102 and the memory system 110 can be coupled to each other via a data bus, a host cable and the like to perform data communication.

The memory system 110 may include a memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements functionally divided. Further, according to an embodiment, the memory device 150 and the controller 130 may be implemented with a single chip or a plurality of chips. The controller 130 may perform a data input/output operation in response to a request input from the external device. For example, when the controller 130 performs a read operation in response to a read request input from an external device, data stored in a plurality of non-volatile memory cells included in the memory device 150 is transferred to the controller 130.

As shown in FIG. 2, the memory device 150 may include a plurality of memory blocks 152, 154, 156. The memory blocks 152, 154, 156 may be understood as a group of non-volatile memory cells in which data is removed together by a single erase operation. Although not illustrated, the memory block 152, 154, 156 may include a page which is a group of non-volatile memory cells that store data together during a single program operation or output data together during a single read operation. For example, one memory block may include a plurality of pages.

For example, the memory device 150 may include a plurality of memory planes or a plurality of memory dies. According to an embodiment, the memory plane may be considered a logical or a physical partition including at least one memory block, a driving circuit capable of controlling an array including a plurality of non-volatile memory cells, and a buffer that can temporarily store data inputted to, or outputted from, non-volatile memory cells.

In addition, according to an embodiment, the memory die may include at least one memory plane. The memory die may be understood to be a set of components implemented on a physically distinguishable substrate. Each memory die may be connected to the controller 130 through a data path. Each memory die may include an interface to exchange an item of data and a signal with the controller 130.

According to an embodiment, the memory device 150 may include at least one memory block 152, 154, 156, at least one memory plane, or at least one memory die. The internal configuration of the memory device 150 shown in FIGS. 1 and 2 may be different according to performance of the memory system 110. An embodiment of the present disclosure is not limited to the internal configuration shown in FIG. 2.

Referring to FIG. 2, the memory device 150 may include a voltage supply circuit 170 capable of supplying at least some voltage into the memory block 152, 154, 156. The voltage supply circuit 170 may supply a read voltage Vrd, a program voltage Vprog, a pass voltage Vpass, or an erase voltage Vers into a non-volatile memory cell included in the memory block. For example, during a read operation for reading data stored in the non-volatile memory cell included in the memory block 152, 154, 156, the voltage supply circuit 170 may supply the read voltage Vrd into a selected non-volatile memory cell. During the program operation for storing data in the non-volatile memory cell included in the memory block 152, 154, 156, the voltage supply circuit 170 may supply the program voltage Vprog into a selected non-volatile memory cell. Also, during a read operation or a program operation performed on the selected nonvolatile memory cell, the voltage supply circuit 170 may supply a pass voltage Vpass into a non-selected nonvolatile memory cell. During the erasing operation for erasing data stored in the non-volatile memory cell included in the memory block 152, 154, 156, the voltage supply circuit 170 may supply the erase voltage Vers into the memory block.

The memory device 150 may store information regarding various voltages which are supplied to the memory block 152, 154, 156 based on which operation is performed. For example, when a non-volatile memory cell in the memory block 152, 154, 156 can store multi-bit data, plural levels of the read voltage Vrd for recognizing or reading the multi-bit data item may be required. The memory device 150 may include a table including information corresponding to plural levels of the read voltage Vrd, corresponding to the multi-bit data item. For example, the table can include bias values stored in a register, each bias value corresponding to a specific level of the read voltage Vrd. The number of bias values for the read voltage Vrd that is used for a read operation may be limited to a preset range. Also, the bias values can be quantized.

The host 102 may include a portable electronic device, e.g., a mobile phone, an MP3 player, a laptop computer, etc., or a non-portable electronic device, e.g., a desktop computer, a game player, a television, a projector, etc.

The host 102 may also include at least one operating system (OS), which can control functions and operations performed in the host 102. The OS can provide interoperability between the host 102 engaged operatively with the memory system 110 and a user who intends to store data in the memory system 110. The OS may support functions and operations corresponding to user's requests. By way of example but not limitation, the OS can be classified into a general operating system and a mobile operating system according to mobility of the host 102. The general operating system may be split into a personal operating system and an enterprise operating system according to system requirements or a user environment. As compared with the personal operating system, the enterprise operating systems can be specialized for securing and supporting high performance computing.

The mobile operating system may be subject to support services or functions for mobility, e.g., a power saving function. The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to the plurality of commands within the memory system 110.

A controller 130 in the memory system 110 may control a memory device 150 in response to a request or a command input from the host 102. For example, the controller 130 may perform a read operation to provide data read from the memory device 150 to the host 102 and may perform a write operation (or a program operation) to store data input from the host 102 in the memory device 150. In order to perform data input/output (I/O) operations, the controller 130 may control and manage internal operations of reading data, programming data, erasing data, or the like.

According to an embodiment, the controller 130 may include a host interface 132, a processor 134, the error correction circuitry (ECC) 138, a power management unit (PMU) 140, a memory interface 142, and a memory 144. Components included in the controller 130 as illustrated in FIG. 2 may vary according to structures, functions, operation performance, or the like, regarding the memory system 110.

For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components may be added to or omitted from the controller 130 according to implementation of the memory system 110.

The host 102 and the memory system 110 each may include a controller or an interface for transmitting and receiving signals, data, and the like, in accordance with one or more predetermined protocols. For example, the host interface 132 in the memory system 110 may include an apparatus capable of transmitting signals, data, and the like to the host 102 or receiving signals, data, and the like from the host 102.

The host interface 132 included in the controller 130 may receive signals, commands (or requests), and/or data input from the host 102 via a bus. For example, the host 102 and the memory system 110 may use a predetermined set of rules or procedures for data communication or a preset interface to transmit and receive data therebetween. Examples of sets of rules or procedures for data communication standards or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like. According to an embodiment, the host interface 132 is a type of layer for exchanging data with the host 102 and is implemented with, or driven by, firmware called a host interface layer (HIL). According to an embodiment, the host interface 132 can include a command queue.

The Integrated Drive Electronics (IDE) or Advanced Technology Attachment (ATA) may be used as one of the interfaces for transmitting and receiving data and, for example, may use a cable including 40 wires connected in parallel to support data transmission and data reception between the host 102 and the memory system 110. When a plurality of memory systems 110 are connected to a single host 102, the plurality of memory systems 110 may be divided into a master and a slave by using a position or a dip switch to which the plurality of memory systems 110 are connected. The memory system 110 set as the master may be used as a main memory device. The IDE (ATA) may include, for example, Fast-ATA, ATAPI, or Enhanced IDE (EIDE).

A Serial Advanced Technology Attachment (SATA) interface is a type of serial data communication interface that is compatible with various ATA standards of parallel data communication interfaces which are used by Integrated Drive Electronics (IDE) devices. The 40 wires in the IDE interface can be reduced to six wires in the SATA interface. For example, 40 parallel signals for the IDE can be converted into 6 serial signals for the SATA interface. The SATA interface has been widely used because of its faster data transmission and reception rate and its less resource consumption in the host 102 used for the data transmission and reception. The SATA interface may connect up to 30 external devices to a single transceiver included in the host 102. In addition, the SATA interface can support hot plugging that allows an external device to be attached to or detached from the host 102, even while data communication between the host 102 and another device is being executed. Thus, the memory system 110 can be connected or disconnected as an additional device, like a device supported by a universal serial bus (USB) even when the host 102 is powered on. For example, in the host 102 having an eSATA port, the memory system 110 may be freely attached to or detached from the host 102 like an external hard disk.

Small Computer System Interface (SCSI) is a type of serial data communication interface used for connecting a computer or a server with other peripheral devices. The SCSI can provide a high transmission speed, as compared with other interfaces such as IDE and SATA. In the SCSI, the host 102 and at least one peripheral device (e.g., memory system 110) are connected in series, but data transmission and reception between the host 102 and each peripheral device may be performed through a parallel data communication. In the SCSI, it is easy to connect or disconnect a device such as the memory system 110 to or from the host 102. The SCSI can support connections of 15 other devices to a single transceiver included in host 102.

Serial Attached SCSI (SAS) can be understood as a serial data communication version of the SCSI. In the SAS, the host 102 and a plurality of peripheral devices are connected in series, and data transmission and reception between the host 102 and each peripheral device may be performed in a serial data communication scheme. The SAS can support connection between the host 102 and the peripheral device through a serial cable instead of a parallel cable, to easily manage equipment using the SAS and enhance or improve operational reliability and communication performance. The SAS may support connections of eight external devices to a single transceiver included in the host 102.

The Non-volatile memory express (NVMe) is a type of interface based at least on a Peripheral Component Interconnect Express (PCIe) designed to increase performance and design flexibility of the host 102, servers, computing devices, and the like equipped with the non-volatile memory system 110. The PCIe can use a slot or a specific cable for connecting a computing device (e.g., host 102) and a peripheral device (e.g., memory system 110). For example, the PCIe can use a plurality of pins (e.g., 18 pins, 32 pins, 49 pins, or 82 pins) and at least one wire (e.g., x1, x4, x8, or x16) to achieve high speed data communication over several hundred MB per second (e.g., 250 MB/s, 500 MB/s, 984.6250 MB/s, or 1969 MB/s). According to an embodiment, the PCIe scheme may achieve bandwidths of tens to hundreds of Giga bits per second. The NVMe can support an operation speed of the non-volatile memory system 110, such as an SSD, that is faster than a hard disk.

According to an embodiment, the host 102 and the memory system 110 may be connected through a universal serial bus (USB). The Universal Serial Bus (USB) is a type of scalable, hot-pluggable plug-and-play serial interface that can provide cost-effective standard connectivity between the host 102 and peripheral devices such as a keyboard, a mouse, a joystick, a printer, a scanner, a storage device, a modem, a video camera, and the like. A plurality of peripheral devices such as the memory system 110 may be coupled to a single transceiver included in the host 102.

Referring to FIG. 2, the error correction circuitry 138 can correct error bits of data read from the memory device 150, and may include an error correction code (ECC) encoder and an ECC decoder. The ECC encoder may perform error correction encoding of data to be programmed in the memory device 150 to generate encoded data into which a parity bit is added, and store the encoded data in the memory device 150. The ECC decoder can detect and correct error bits contained in the data read from the memory device 150 when the controller 130 reads the data stored in the memory device 150. For example, after performing error correction decoding on the data read from the memory device 150, the error correction circuitry 138 determines whether the error correction decoding has succeeded or not, and outputs an instruction signal, e.g., a correction success signal or a correction fail signal, based on a result of the error correction decoding. The error correction circuitry 138 may use a parity bit, which has been generated during the ECC encoding process for the data stored in the memory device 150, in order to correct the error bits of the read data items. When the number of the error bits is greater than or equal to the number of correctable error bits, the error correction circuitry 138 may not correct the error bits and instead may output the correction fail signal indicating failure in correcting the error bits.

According to an embodiment, the error correction circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above-described codes. The error correction circuitry 138 shown in FIG. 2 can include at least some of the components included in the controller 130 shown in FIG. 1.

For example, the ECC decoder may perform hard decision decoding or soft decision decoding on data transmitted from the memory device 150. The hard decision decoding can be understood as one of two methods broadly classified for error correction. The hard decision decoding may include an operation of correcting an error bit by reading digital data of '0' or '1' from a non-volatile memory cell in the memory device 150. Because the hard decision decoding handles a binary logic signal, the circuit/algorithm design or configuration may be simpler and a processing speed may be faster than the soft decision decoding.

The soft decision decoding may quantize a threshold voltage of a non-volatile memory cell in the memory device 150 by two or more quantized values, e.g., multiple bit data, approximate values, an analog value, and the like, in order to correct an error bit based on the two or more quantized values. The controller 130 can receive two or more alphabets or quantized values from a plurality of non-volatile memory cells in the memory device 150, and then perform a decoding based on information generated by characterizing the quantized values as a combination of information such as conditional probability or likelihood.

According to an embodiment, the ECC decoder may use a low-density parity-check and generator matrix (LDPC-GM) code among methods designed for the soft decision decoding. The low-density parity-check (LDPC) code uses an algorithm that can read values of data from the memory device 150 in several bits according to reliability, not simply data of 1 or 0 like the hard decision decoding, and iteratively repeats it through a message exchange in order to improve reliability of the values. Then, the values are finally determined as data of 1 or 0. For example, a decoding algorithm using LDPC codes can be understood as probabilistic decoding. In the hard decision decoding, a value output from a non-volatile memory cell is decoded as 0 or 1. Compared to the hard decision decoding, the soft decision decoding can determine the value stored in the non-volatile memory cell based on the stochastic information. Regarding bit-flipping which may be considered an error that can occur in the memory device 150, the soft decision decoding may provide improved probability of correcting the error and recovering data, as well as providing reliability and stability of corrected data. The LDPC-GM code may have a scheme in which internal LDGM codes can be concatenated in series with high-speed LDPC codes.

According to an embodiment, the ECC decoder may use, for example, low-density parity-check convolutional codes (LDPC-CCs) for the soft decision decoding. The LDPC-CCs may have a scheme using a linear time encoding and a pipeline decoding based on a variable block length and a shift register.

According to an embodiment, the ECC decoder may use, for example, a Log Likelihood Ratio Turbo Code (LLR-TC) for the soft decision decoding. A Log Likelihood Ratio (LLR) may be calculated as a non-linear function for a distance between a sampled value and an ideal value. In addition, a Turbo Code (TC) may include a simple code, for example, a Hamming code, in two or three dimensions and repeat decoding in a row direction and a column direction to improve reliability of values.

The power management unit (PMU) 140 may control electrical power provided to the controller 130. The PMU 140 may monitor the electrical power supplied to the memory system 110, e.g., a voltage supplied to the controller 130, and provide the electrical power to components included in the controller 130. The PMU 140 may not only detect power-on or power-off, but also generate a trigger signal to enable the memory system 110 to urgently back up a current state when the electrical power supplied to the memory system 110 is unstable. According to an embodiment, the PMU 140 may include a device or a component capable of accumulating electrical power that may be used in an emergency.

The memory interface 142 may serve as an interface for handling commands and data transferred between the controller 130 and the memory device 150, in order to allow the controller 130 to control the memory device 150 in response to a command or a request input from the host 102. The memory interface 142 may generate a control signal for the memory device 150 and may process data input to, or output from, the memory device 150 under the control of the processor 134 in a case when the memory device 150 is a flash memory.

For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) for exchanging data with the memory device 150.

According to an embodiment, the memory interface 142 may support an open NAND flash interface (ONFi), a toggle mode, or the like, for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or the like.

The memory 144 may be used as a working memory of the memory system 110 or the controller 130, while temporarily storing transactional data for operations performed in the memory system 110 and the controller 130. For example, the memory 144 may temporarily store read data items output from the memory device 150 in response to a read request from the host 102 before the read data items are output to the host 102. In addition, the controller 130 may temporarily store write data items input from the host 102 in the memory 144 before programming the write data items in the memory device 150. When the controller 130 controls operations, such as a data read operation, a data write or program operation, a data erase operation, etc., of the memory device 150, data transmitted between the controller 130 and the memory device 150 of the memory system 110 may be temporarily stored in the memory 144.

In addition to the read data items or write data items, the memory 144 may store information, e.g., map data, read requests, program requests, etc. used for inputting or outputting data between the host 102 and the memory device 150. According to an embodiment, the memory 144 may include one or more of a command queue, a program memory, a data memory, a write buffer/cache, a read buffer/cache, a data buffer/cache, a map buffer/cache, and so on. The controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 2 illustrates, for example, the memory 144 disposed within the controller 130, embodiments are not limited thereto. The memory 144 may be located within or external to the controller 130. For instance, the memory 144 may be embodied by an external volatile memory having a memory interface transferring data and/or signals between the memory 144 and the controller 130.

The processor 134 may control the overall operations of the memory system 110. For example, the processor 134 can control a program operation or a read operation of the memory device 150 in response to a write request or a read request entered from the host 102. According to an embodiment, the processor 134 may execute firmware to control the program operation or the read operation in the memory system 110. Herein, the firmware may be referred to as a flash translation layer (FTL). An example of the FTL will be described in detail, referring to FIGS. 3 and 4. According to an embodiment, the processor 134 may be implemented with a microprocessor, a central processing unit (CPU), or the like.

According to an embodiment, the memory system 110 may be implemented with at least one multi-core processor. The multi-core processor is a type of circuit or chip in which two or more cores, which are considered distinct processing regions, are integrated. For example, when a plurality of cores in the multi-core processor drive or execute a plurality of flash translation layers (FTLs) independently, a data input/output speed (or performance) of the memory system 110 may be improved. According to an embodiment, the data input/output (I/O) operations in the memory system 110 may be independently performed through different cores in the multi-core processor.

The processor 134 in the controller 130 may perform an operation corresponding to a request or a command input from the host 102. Further, the memory system 110 may perform an operation independent from a command or a request input from the host 102. In one case, an operation performed by the controller 130 in response to the request or the command input from the host 102 may be considered a foreground operation, while an operation performed by the controller 130 independently from the request or the command input from the host 102 may be considered a background operation. The controller 130 can perform foreground or background operations for reading, writing, or erasing data in the memory device 150. In addition, a parameter set operation corresponding to a set parameter command or a set feature command as a set command transmitted from the host 102 may be considered a foreground operation. Background operations that can be performed without a command transmitted from the host 102 by the controller 130 include garbage collection (GC), wear leveling (WL), bad block management for identifying and processing bad blocks, or the like.

According an embodiment, substantially similar operations may be performed as both the foreground operation and the background operation. For example, when the memory system 110 performs garbage collection in response to a request or a command input from the host 102 (e.g., Manual GC), the garbage collection can be considered a foreground operation. When the memory system 110 performs garbage collection independently of the host 102 (e.g., Auto GC), the garbage collection can be considered a background operation.

When the memory device 150 includes a plurality of dies (or a plurality of chips) each including a plurality of non-volatile memory cells, the controller 130 may perform parallel processing regarding plural requests or commands input from the host 102 in order to improve performance of the memory system 110. For example, the transmitted requests or commands may be divided into plural groups including at least some of a plurality of planes, a plurality of dies, or a plurality of chips included in the memory device 150, and the plural groups of requests or commands are processed individually or in parallel in each plane, each die or each chip.

The memory interface 142 in the controller 130 may be connected to the plurality of dies or chips in the memory device 150 through at least one channel and at least one way. When the controller 130 distributes and stores data in the plurality of dies through each channel or each way in response to requests or commands associated with a plurality of pages including non-volatile memory cells, a plurality of operations corresponding to the requests or the commands can be performed simultaneously or in parallel in the plurality of dies or planes. Such a processing method or scheme can be considered to be an interleaving method. Because a data input/output speed of the memory system 110 increases by operating with the interleaving method, data I/O performance of the memory system 110 can be improved.

By way of example but not limitation, the controller 130 can recognize statuses of a plurality of channels (or ways) associated with the plurality of dies included in the memory device 150. The controller 130 may determine a status of each channel or each way as one of a busy status, a ready status, an active status, an idle status, a normal status, and an abnormal status. The determination of which channel or way an instruction (and/or a data) is delivered through by the controller can be associated with a physical block address. The controller 130 may refer to descriptors delivered from the memory device 150. The descriptors may include a block or page of parameters describing something about the memory device 150. The descriptors can have a predetermined format or structure. For instance, the descriptors may include device descriptors, configuration descriptors, unit descriptors, and the like. The controller 130 may refer to, or use, the descriptors to determine which channel(s) or way(s) is used to exchange an instruction or data.

Referring to FIG. 2, the memory device 150 in the memory system 110 may include a plurality of memory blocks 152, 154, 156. Each of the plurality of memory blocks 152, 154, 156 includes a plurality of non-volatile memory cells. According to an embodiment, the memory block 152, 154, 156 can be a group of non-volatile memory cells erased together. The memory block 152, 154, 156 may include a plurality of pages which is a group of non-volatile memory cells read or programmed together.

In one embodiment, each memory block 152, 154, or 156 may have a three-dimensional stack structure for a high integration. Further, the memory device 150 may include a plurality of dies, each die including a plurality of planes, each plane including the plurality of memory blocks 152, 154, 156. A configuration of the memory device 150 may be changed depending on performance of the memory system 110.

FIG. 2 illustrates the memory device 150 includes the plurality of memory blocks 152, 154, and 156. The plurality of memory blocks 152, 154, and 156 may be any of single-level cell (SLC) memory blocks, multi-level cell (MLC) memory blocks, or the like, according to the number of bits that can be stored in one memory cell. An SLC memory block includes a plurality of pages implemented by memory cells, each memory cell storing one bit of data. An SLC memory block may have higher data I/O operation performance and higher durability than the MLC memory block. The MLC memory block includes a plurality of pages implemented by memory cells, each memory cell storing multi-bit data, e.g., two or more bits of data. The MLC memory block may have larger storage capacity for the same space compared to the SLC memory block. The MLC memory block can be highly integrated in a view of storage capacity.

In an embodiment, the memory device 150 may be implemented with MLC memory blocks such as a double level cell (DLC) memory block, a triple-level cell (TLC) memory block, a quadruple-level cell (QLC) memory block, and a combination thereof. The DLC memory block may include a plurality of pages implemented by memory cells, each memory cell capable of storing 2-bit data. The TLC memory block can include a plurality of pages implemented by memory cells, each memory cell capable of storing 3-bit data. The QLC memory block can include a plurality of pages implemented by memory cells, each memory cell capable of storing 4-bit data. In another embodiment, the memory device 150 can be implemented with a block including a plurality of pages implemented by memory cells, each memory cell capable of storing five or more bits of data.

According to an embodiment, the controller 130 may use an MLC memory block included in the memory device 150 as an SLC memory block that stores one-bit data in one memory cell. A data input/output speed of the multi-level cell (MLC) memory block can be slower than that of the SLC memory block. That is, when the MLC memory block is used as the SLC memory block, a margin for a read or program operation can be reduced. For example, the controller 130 may perform a data input/output operation with a higher speed when the MLC memory block is used as the SLC memory block. Thus, the controller 130 may use the MLC memory block as a SLC buffer to temporarily store data because the buffer may require a high data input/output speed for improving performance of the memory system 110.

Further, according to an embodiment, the controller 130 can program data in an MLC a plurality of times without performing an erase operation on a specific MLC memory block included in the memory device 150. In general, non-volatile memory cells do not support data overwrite. However, the controller 130 may program 1-bit data in the MLC a plurality of times using a feature in which the MLC is capable of storing multi-bit data. For an MLC overwrite operation, the controller 130 may store the number of program times as separate operation information when 1-bit data is programmed in an MLC. According to an embodiment, an operation for uniformly levelling threshold voltages of the MLCs may be carried out before another 1-bit data is programmed in the same MLCs, each having stored 1-bit data.

In an embodiment, the memory device 150 is embodied as a non-volatile memory such as a flash memory, for example, a NAND flash memory, a NOR flash memory, or the like. In another embodiment, the memory device 150 may be implemented by at least one of a phase change random access memory (PCRAM), a ferroelectrics random access memory (FRAM), a transfer torque random access memory (STT-RAM), and a spin transfer torque magnetic random access memory (STT-MRAM), or the like.

Referring to FIG. 3, the controller 130 in a memory system operates along with the host 102 and the memory device 150. As illustrated, the controller 130 includes the host interface 132, a flash translation layer (FTL) 240, the memory interface 142, and the memory 144 previously identified with reference to FIG. 2.

According to an embodiment, the error correction circuitry 138 illustrated in FIG. 2 may be included in the flash translation layer (FTL) 240. In another embodiment, the error correction circuitry 138 may be implemented as a separate module, a circuit, firmware, or the like, which is included in or associated with the controller 130.

The host interface 132 may handle commands, data, and the like transmitted from the host 102. By way of example but not limitation, the host interface 132 may include a command queue 56, a buffer manager 52, and an event queue 54. The command queue 56 may sequentially store the commands, the data, and the like received from the host 102, and output them to the buffer manager 52, for example, in an order in which they are stored in the command queue 56. The buffer manager 52 may classify, manage, or adjust the commands, the data, and the like received from the command queue 56. The event queue 54 may sequentially transmit events for processing the commands, the data, and the like received from the buffer manager 52.

A plurality of commands or data of the same characteristic may be transmitted from the host 102, or a plurality of commands and data of different characteristics may be transmitted to the memory system 110 after being mixed or jumbled by the host 102. For example, a plurality of commands for reading data, i.e., read commands, may be delivered, or a command for reading data, i.e., a read command, and a command for programming/writing data, i.e., a write command, may be alternately transmitted to the memory system 110. The host interface 132 may sequentially store commands, data, and the like, which are transmitted from the host 102, in the command queue 56. Thereafter, the host interface 132 may estimate or predict what type of internal operations the controller 130 will perform according to the characteristics of the commands, the data, and the like, which have been transmitted from the host 102. The host interface 132 may determine a processing order and a priority of commands, data and the like based on their characteristics.

According to the characteristics of the commands, the data, and the like transmitted from the host 102, the buffer manager 52 in the host interface 132 is configured to determine whether the buffer manager 52 should store the commands, the data, and the like in the memory 144, or whether the buffer manager 52 should deliver the commands, the data, and the like to the flash translation layer (FTL) 240. The event queue 54 receives events, transmitted from the buffer manager 52, which are to be internally executed and processed by the memory system 110 or the controller 130 in response to the commands, the data, and the like, and delivers the events to the flash translation layer (FTL) 240 in the order of the events input to the event queue 54.

In accordance with an embodiment, the flash translation layer (FTL) 240 illustrated in FIG. 3 may implement a multi-thread scheme to perform data input/output (I/O) operations. A multi-thread FTL may be implemented through a multi-core processor using multi-thread included in the controller 130.

In accordance with an embodiment, the flash translation layer (FTL) 240 may include a host request manager (HRM) 46, a map manager (MM) 44, a state manager 42, and a block manager 48. The host request manager (HRM) 46 may manage the events transmitted from the event queue 54. The map manager (MM) 44 may handle or control map data. The state manager 42 may perform garbage collection (GC) or wear leveling (WL). The block manager 48 may execute commands or instructions onto a block in the memory device 150.

By way of example but not limitation, the host request manager (HRM) 46 may use the map manager (MM) 44 and the block manager 48 to handle or process requests according to read and program commands and events which are delivered from the host interface 132. The host request manager (HRM) 46 may send an inquiry request to the map manager (MM) 44 to determine a physical address corresponding to a logical address which is entered with the events. The host request manager (HRM) 46 may send a read request with the physical address to the memory interface 142 to process the read request, i.e., handle the events. In one embodiment, the host request manager (HRM) 46 may send a program request (or a write request) to the block manager 48 to program data to a specific empty page storing no data in the memory device 150, and then may transmit a map update request corresponding to the program request to the map manager (MM) 44 in order to update an item relevant to the programmed data in information of mapping the logical and physical addresses to each other.

The block manager 48 may convert a program request delivered from the host request manager (HRM) 46, the map manager (MM) 44, and/or the state manager 42 into a flash program request used for the memory device 150, in order to manage flash blocks in the memory device 150. In order to maximize or enhance program or write performance of the memory system 110, the block manager 48 may collect program requests and send flash program requests for multiple-plane and one-shot program operations to the memory interface 142. In an embodiment, the block manager 48 sends several flash program requests to the memory interface 142 to enhance or maximize parallel processing of a multi-channel and multi-directional flash controller.

In an embodiment, the block manager 48 may manage blocks in the memory device 150 according to the number of valid pages, select and erase blocks having no valid pages when a free block is needed, and select a block including the least number of valid pages when it is determined that garbage collection is to be performed. The state manager 42 may perform garbage collection to move valid data stored in the selected block to an empty block and erase data stored in the selected block so that the memory device 150 may have enough free blocks (i.e., empty blocks with no data). When the block manager 48 provides information regarding a block to be erased to the state manager 42, the state manager 42 may check all flash pages of the block to be erased to determine whether each page of the block is valid.

For example, to determine validity of each page, the state manager 42 may identify a logical address recorded in an out-of-band (OOB) area of each page. To determine whether each page is valid, the state manager 42 may compare a physical address of the page with a physical address mapped to a logical address obtained from an inquiry request. The state manager 42 sends a program request to the block manager 48 for each valid page. A map table may be updated by the map manager 44 when a program operation is complete.

The map manager 44 may manage map data, e.g., a logical-physical map table. The map manager 44 may process various requests, for example, queries, updates, and the like, which are generated by the host request manager (HRM) 46 or the state manager 42. The map manager 44 may store the entire map table in the memory device 150, e.g., a flash/non-volatile memory, and cache mapping entries according to the storage capacity of the memory 144. When a map cache miss occurs while processing inquiry or update requests, the map manager 44 may send a read request to the memory interface 142 to load a relevant map table stored in the memory device 150. When the number of dirty cache blocks in the map manager 44 exceeds a certain threshold value, a program request may be sent to the block manager 48, so that a clean cache block is made and a dirty map table may be stored in the memory device 150.

When garbage collection is performed, the state manager 42 copies valid page(s) into a free block, and the host request manager (HRM) 46 may program the latest version of the data for the same logical address of the page and concurrently issue an update request. When the state manager 42 requests the map update in a state in which the copying of the valid page(s) is not completed normally, the map manager 44 might not perform the map table update. This is because the map request is issued with old physical information when the state manger 42 requests a map update and a valid page copy is completed later. The map manager 44 may perform a map update operation to ensure accuracy when, or only if, the latest map table still points to the old physical address.

Figure 4:
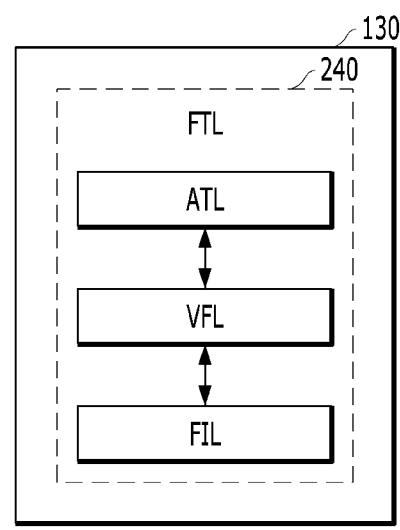
FIG. 4 illustrates internal configuration of a controller shown in FIGS. 1 to 3 according to embodiments of the present disclosure.

FIG. 4 illustrates internal configuration of the controller shown in FIGS. 1 to 3 according to an embodiment of the present disclosure.

Referring to FIG. 4, the flash translation layer (FTL) 240 in the controller 130 can be divided into three layers: an address translation layer ATL; a virtual flash layer VFL; and a flash Interface Layer FIL.

For example, the address translation layer ATL may convert a logical address LA transmitted from a file system into a logical page address. The address translation layer ATL can perform an address translation process regarding a logical address space. That is, the address translation layer ATL can perform an address translation process based on mapping information in which the logical page address LPA of the flash memory 140 is mapped to the logical address LA transmitted from the host. Such logical-to-logical address mapping information (hereinafter referred to as L2L mapping) may be stored in an area in which metadata is stored in the memory device 150.

The virtual flash layer VFL may convert the logical page address LPA, which is mapped by the address translation layer ATL, into a virtual page address VPA. Here, the virtual page address VPA may correspond to a physical address of a virtual memory device. That is, the virtual page address VPA may correspond to the memory block 60 in the memory device 150. If there is a bad block among the memory blocks 60 in the memory device 150, the bad block may be excluded by the virtual flash layer VFL. In addition, the virtual flash layer VFL can include a recovery algorithm for scanning a scan area to restore the logical-to-virtual address mapping information (L2V mapping) stored in the memory device 150 and mapping information in the data region for storing user data. The recovery algorithm can be capable of recovering the logical-to-virtual address mapping information (L2V mapping). The virtual flash layer VFL may perform an address conversion process regarding the virtual address space, based on the logical-to-virtual address mapping information (L2V mapping) restored through the recovery algorithm.

The flash interface layer FIL can convert a virtual page address of the virtual flash layer VFL into a physical page address of the memory device 150. The flash interface layer FIL performs a low-level operation for interfacing with the memory device 150. For example, the flash interface layer FIL can include a low-level driver for controlling hardware of the memory device 150, an error correction code (ECC) for checking and correcting an error in data transmitted from the memory device 150, and a module for performing operations such as Bad Block Management (BBM).

Figure 5:
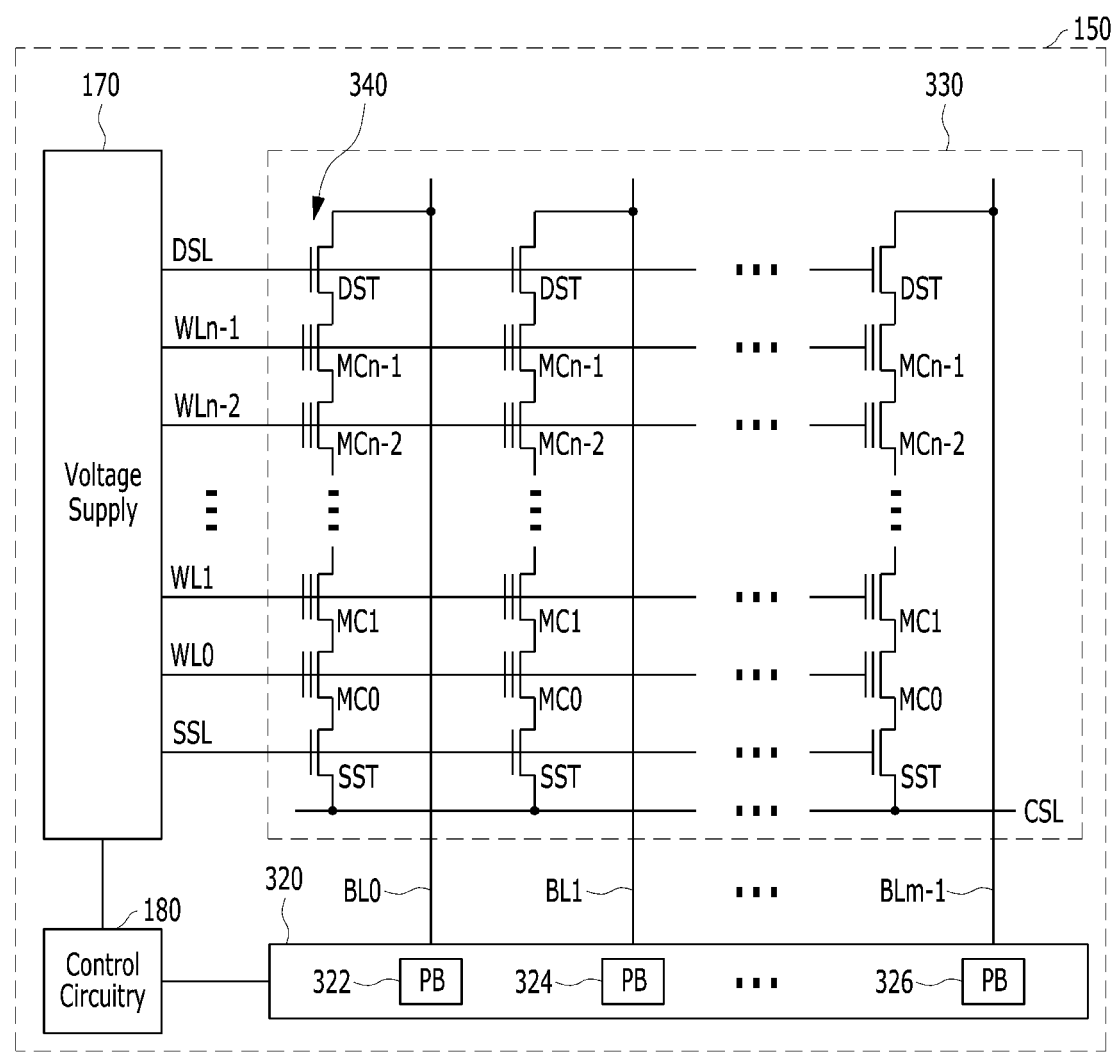
FIG. 5 illustrates a memory device according to an embodiment of the present disclosure.

FIG. 5 illustrates an operation timing for confirming an operation state and an operation result of planes included in a memory system in accordance with an embodiment of the present disclosure. Specifically, FIG. 5 schematically illustrates a memory cell array circuit in a memory die or memory plane included in the memory device 150 according to an embodiment of the present disclosure.

Referring to FIG. 5, the memory device 150 may include at least one memory group 330 having a plurality of cell strings 340. Each cell string 340 may include a plurality of non-volatile memory cells MC0 to MCn−1 connected to a respective bit line of a plurality of bit lines BL0 to BLm−1. The cell strings 340 are disposed in respective columns of the memory group 330, and each cell string 340 can include at least one drain select transistor DST and at least one source select transistor SST. The non-volatile memory cells MC0 to MCn-1 of each cell string 340 may be connected in series between a drain select transistor DST and a source select transistor SST. Each of the non-volatile memory cells MC0 to MCn-1 may be configured as a multi-level cell (MLC) that stores a data item having plural bits per cell. The cell strings 340 may be electrically connected to corresponding bit lines of the bit lines BL0 to BLm-1.

In the embodiment shown in FIG. 5, the memory group 330 may include NAND-type flash memory cells MC0 to MCn-1. In another embodiment, the memory group 330 can be implemented as a NOR-type flash memory, a hybrid flash memory in which at least two different types of memory cells are mixed or combined, or a one-chip NAND flash memory in which a controller is embedded in a single memory chip. In an embodiment, the memory group 330 can include a flash memory cell including a charge trap flash (CTF) layer that includes a conductive floating gate or insulating layer.

FIG. 5 shows an embodiment of a memory system 110 which may include the memory device 150. In this embodiment, the memory group 330 in memory device 150 may include one or more memory blocks 152, 154, 156. According to an embodiment, the memory device 150 can have a two-dimensional (2D) or three-dimensional (3D) structure. For example, each of the memory blocks 152, 154, 156 in the memory device 150 may be implemented as a 3D structure or a vertical structure. Each of the memory blocks 152, 154, 156 may have a three-dimensional structure extending along first to third directions, for example, an x-axis direction, a y-axis direction, and a z-axis direction.

The memory group 330 including the plurality of memory blocks 152, 154, 156 can be coupled to a plurality of bit lines BL, a plurality of string select lines SSL, and a plurality of drain select lines DSL, a plurality of word lines WL, a plurality of dummy word lines DWL, and a plurality of common source lines CSL. In an embodiment, the memory group 330 can include a plurality of NAND strings NS which, for example, may respectively correspond to cell strings 340. Each NAND string NS may include a plurality of memory cells MC and may be connected to a respective bit line of the bit lines BL. In addition, the string select transistor SST of each NAND string NS may be connected to a common source line CSL, and the drain select transistor DST of each NAND string NS can be connected to a corresponding bit line BL. In each NAND string NS, the memory cells MC may be arranged between the string select transistor SST and the drain select transistor DST.

Referring to FIG. 5, the memory device 150 can include a voltage supply circuit 170 which can supply a word line voltage e.g., one or more predetermined voltages such as a program voltage, a read voltage, and a pass voltage, for respective word lines according to an operation mode, or may supply a voltage to a bulk (e.g., a well region) in which each memory block including the memory cells MC are formed. In this case, a voltage generating operation of the voltage supply circuit 170 may be performed under a control of a control circuitry 180. Also, the voltage supply circuit 170 may generate a plurality of variable read voltages to distinguish a plurality of data items from each other. The plurality of variable read voltages can be applied to non-volatile memory cells in the memory group 330.

In response to the control of the control circuit, one of the memory blocks (or sectors) of the memory cell array may be selected, and one of the word lines of the selected memory block may be selected. Word line voltages may be supplied to the selected word line and the unselected word line, individually. The voltage supply circuit 170 may include a voltage generation circuit (e.g., refer to FIGS. 6 to 8) for generating target voltages having various levels.

In an embodiment, the voltage supply circuit 170 may be coupled to a first pin or pad receiving a first power voltage VCC applied from the outside (e.g., an external device) and a second pin or pad receiving the second power voltage VPP applied from the external device. The second power voltage VPP may have a greater voltage level, e.g., twice or higher than that of the first power voltage VCC. For example, the first power voltage VCC may have a voltage level of 2.0V to 5.5V, while the second power supply voltage may have a voltage level of 9V to 13V.

According to an embodiment, the voltage supply circuit 170 can include a voltage generation circuit for more rapidly generating the target voltages of various levels used in the memory group 330. The voltage generation circuit can use the second power supply voltage VPP to generate a target voltage, which may have a higher voltage level than the second power voltage VPP.

The memory device 150 may also include a read/write circuit 320 controlled by the control circuitry 180. The read/write circuit 320 may operate as a sense amplifier or a write driver according to an operation mode. For example, in a verify operation and a read operation, the read/write circuit 320 may operate as a sense amplifier for reading the data item from the memory cell array. In a program operation, the read/write circuit 320 may operate as a write driver that controls potentials of bit lines according to a data item to be stored in the memory cell array. The read/write circuit 320 may receive the data item to be programmed to the cell array from page buffers during the program operation. The read/write circuit 320 can drive bit lines based on the input data item. To this end, the read/write circuit 320 may include a plurality of page buffers (PB) 322, 324, 326, with each page buffer corresponding to each column (or each bit line) or each column pair (or each bit line pair). According to an embodiment, a plurality of latches may be included in each of the page buffers 322, 324, 326.

The page buffers 322, 324, 326 may be coupled to a data input/output device (e.g., a serialization circuit or a serializer) through a plurality of buses BUS. When each of the page buffers 322, 324, 326 is coupled to the data input/output device through different buses, a delay that may occur in data transmission from the page buffers 322, 324, 326 can be reduced. For example, each page buffer 322, 324, 326 can perform the data transmission without a waiting time.

According to an embodiment, the memory device 150 may receive a write command, write data items, and information (e.g., a physical address) regarding a location in which the write data items are to be stored. The control circuitry 180 causes the voltage supply circuit 170 to generate a program pulse, a pass voltage, etc., used for a program operation performed in response to a write command, and to generate one or more voltages used for a verification operation performed after the program operation.

When a multi-bit data item is programmed in non-volatile memory cells included in the memory group 330, the error rate might be higher than that when a single-bit data item is stored in the non-volatile memory cells. For example, an error in the non-volatile memory cells may be induced due to cell-to-cell interference (CCI). In order to reduce error in the non-volatile memory cells, a width (deviation) of a threshold voltage distribution corresponding to stored data items between the non-volatile memory cells, should be reduced.

To this end, the memory device 150 can perform an incremental step pulse programming (ISPP) operation to effectively make a narrow threshold voltage distribution of the non-volatile memory cells. In an embodiment, the memory device 150 can use the ISPP operation for multi-step program operations. For example, the memory device 150 may divide a program operation into a Least Significant Bit (LSB) program operation and a Most Significant Bit (MSB) operation according to a predetermined order between the non-volatile memory cells or pages.

FIG. 6 illustrates a data group programmed in the memory device 150 according to an embodiment of the present disclosure.

Referring to FIG. 6, the memory device 150 can include at least one memory die D0. The memory die D0 can include a plurality of memory blocks Block0, Block1, Block2, Block3. The plurality of memory blocks Block0, Block1, Block2, Block3 can be located in different planes P0, P1, P2, P3.

The memory blocks Block0, Block1, Block2, Block3 can include a plurality of non-volatile memory cells connected to each of a plurality of word lines WL0, WL1, WL2, WL3, WL4, WL5, WL6, WL7. A plurality of non-volatile memory cells connected through the first word line WL0 in the first memory block Block0 may be set as a first page. The first page may be divided into four sub-pages (VPN OFF:0 to 3).

The non-volatile memory cell can store 3-bit data. For example, the 3-bit data can include LSB(L) data, CSB(C) data, and MSB(M) data.

In FIG. 6, a first data item D0 is programmed in a first subpage of a first page coupled to a first word line WL0 in the first memory block Block0, a second data item D1 is programmed in a second subpage of the first page, and a third data item D2 is programmed in a third subpage of the first page, and a fourth data item D3 is programmed in a fourth subpage of the first page. Similarly, a fifth data item D4 is programmed in a first sub-page of a first page coupled to a first word line WI0 in the second memory block Block1, a sixth data item D5 is programmed in a second sub-page of the first page in the second memory block Block1, a seventh data item D6 is programmed in a third subpage of the first page in the second memory block Block1, and an eighth data item D7 is programmed in a fourth subpage of the first page in the second memory block Block1.

Referring to FIG. 6, the first page group P_Grp_0 includes plural pages, i.e., groups of plural non-volatile memory cells coupled to a plurality of word lines WL0 to WL3. In addition, 188 data items D0 to D187 and 12 parities Parity0 to Parity11 can be programmed in the first page group P_Grp_0. Similarly, the second page group P_Grp_1 includes plural pages, i.e., groups of plural non-volatile memory cells coupled to a plurality of different word lines WL4 to WL7 in the memory blocks Block0, Block1, Block2, Block3 included in different planes P0, P1, P2, P3. Further, another 188 data items D0 to D187 and corresponding 12 parities Parity0 to Parity11 can be programmed into a second page group P_Grp_1.

Moreover, a data number and a parity number included in the first page group P_Grp_0 or the second page group P_Grp_1 described in FIG. 6 are used for distinguishing a plurality of data items and a plurality of parities from each other. The data number and the parity number do not mean a program order or a program sequence regarding the plurality of data items and the plurality of parities within the memory device 150.

FIG. 7 illustrates a calculation for generating a parity included in the data group shown in FIG. 6 according to an embodiment of the present disclosure. For example, FIG. 7 shows a method for calculating the 12 parities Parity0 to Parity11 programmed in the first page group P_Grp_0 described with reference to FIG. 6.

Figure 12:
FIG. 12 illustrates a data recovery operation in a situation shown in FIG. 11 according to embodiments of the present disclosure.

Referring to FIGS. 6 and 7, 12 parities Parity0, Parity0, . . . , Parity11 can be individually generated through an exclusive-OR (XOR) operation on some data items among the plurality of data items D0 to D187.

For example, the first parity Parity0 is stored in the LSB page of the first subpage (VPN OFF:0) connected to a fourth word line WL3 of the fourth memory block Block3 in the first page group P_Grp_0 (L). Herein, the first parity Parity0 can be calculated by an exclusive OR (XOR) operation on 15 data items D0, D4, D8, D12, D48, D52, D56, D60, D96, D100, D104, D108, D144, D148, D152 stored in plural memory cells connected to the first to fourth word lines WL0 to WL3 of each memory block Block0, Block1, Block2, Block3 in the first page group P_Grp_0. Further, the first parity Parity0 calculated by the exclusive OR (XOR) operation on 15 data items each stored in the LSB page (L) of the first subpage (VPN OFF: 0) connected to each word line in each memory block can be stored at a location of the LSB (L) page of the first subpage (VPN OFF: 0) connected to the fourth word line WL3 of the fourth memory block Block3.

Like the first parity Parity0, a second parity Parity1 can be calculated by an exclusive OR (XOR) operation on 15 data items stored in the LSB (L) page of the second subpage (VPN OFF:1) connected to each word line in each memory block. The second parity Parity1 can be programmed in the LSB (L) page of the second subpage (VPN OFF:1) connected to the fourth word line WL3 of the fourth memory block Block3. Similarly, a twelfth parity Parity11 can be calculated by an exclusive OR (XOR) operation on 15 data items stored in the MSB (M) page of the fourth subpage (VPN OFF:3) connected to each word line in each memory block. The twelfth parity Parity11 can be stored in the MSB (M) page of the fourth subpage (VPN OFF:1) connected to the fourth word line WL3 of the fourth memory block Block3.

The controller 130 can arrange plural data items for each page connected to each word line in each memory block. Each page can include 3-bit page data LSB(L), CSB(C), MSB(M) in 4 subpages (VPN OFF: 0~3). Accordingly, each page can store 12 data items in each memory block. Further, the controller 130 can generate 12 parities Parity0 to Parity11 based on the plural data items programmed in the corresponding positions through the exclusive OR (XOR) operation. Herein, the number of memory blocks, the number of word lines, and the number of subpages constituting each page group P_Grp_0, P_Grp_1 can vary according to internal configuration of the memory device 150. A size of the data group stored in each page group can be different based on configuration of the page groups P_Grp_0, P_Grp_1.

To increase data safety, the controller 130 can perform an exclusive OR (XOR) on the data items distributed over and stored in each of the page groups P_Grp_0, P_Grp_1 to generate each parity Parity0 to Parity11. When a parity is calculated by performing an exclusive-OR on data items stored in adjacent locations, a possibility of simultaneous occurrence of plural errors (e.g., UECC) during a read operation may increase. For example, when a defect occurs in a single specific memory cell or a single page, it is likely that a data item programmed in the defective memory cell or the defective page can be recovered based on other data items which are distributed over and stored in the plural memory blocks or the plural memory planes. However, when data items constituting each data group are stored in adjacent locations such as the same block or the same plane, an exclusive OR (XOR) operation could be performed on the data items stored in the LSB page, the CSB page, and the MSB page corresponding to 3-bit data LSB(L), CSB(C), MSB(M) stored in a specific non-volatile memory cell. Even when a defect occurs in a single non-volatile memory cell, errors may occur in three data items. In this case, the parity calculated by the exclusive-OR (XOR) operation might not be useful to recover or restore the data items including errors.

The controller 130 can determine and configure a data group to be programmed in each of the page groups P_Grp_0, P_Grp_1 in the memory device 150. The controller 130 can first store data items, which would be transmitted and stored in the memory device 150, in the memory 144, and organize each of the data groups corresponding to each of page groups P_Grp_0, P_Grp_1. The controller 130 can include, in each data group, a parity calculated according to the logical operation described with reference to FIG. 7. The controller 130 may transmit each of the data groups to the memory device 150, and the memory device 150 may perform a program operation in each of page groups P_Grp_0, P_Grp_1.

Figure 8:
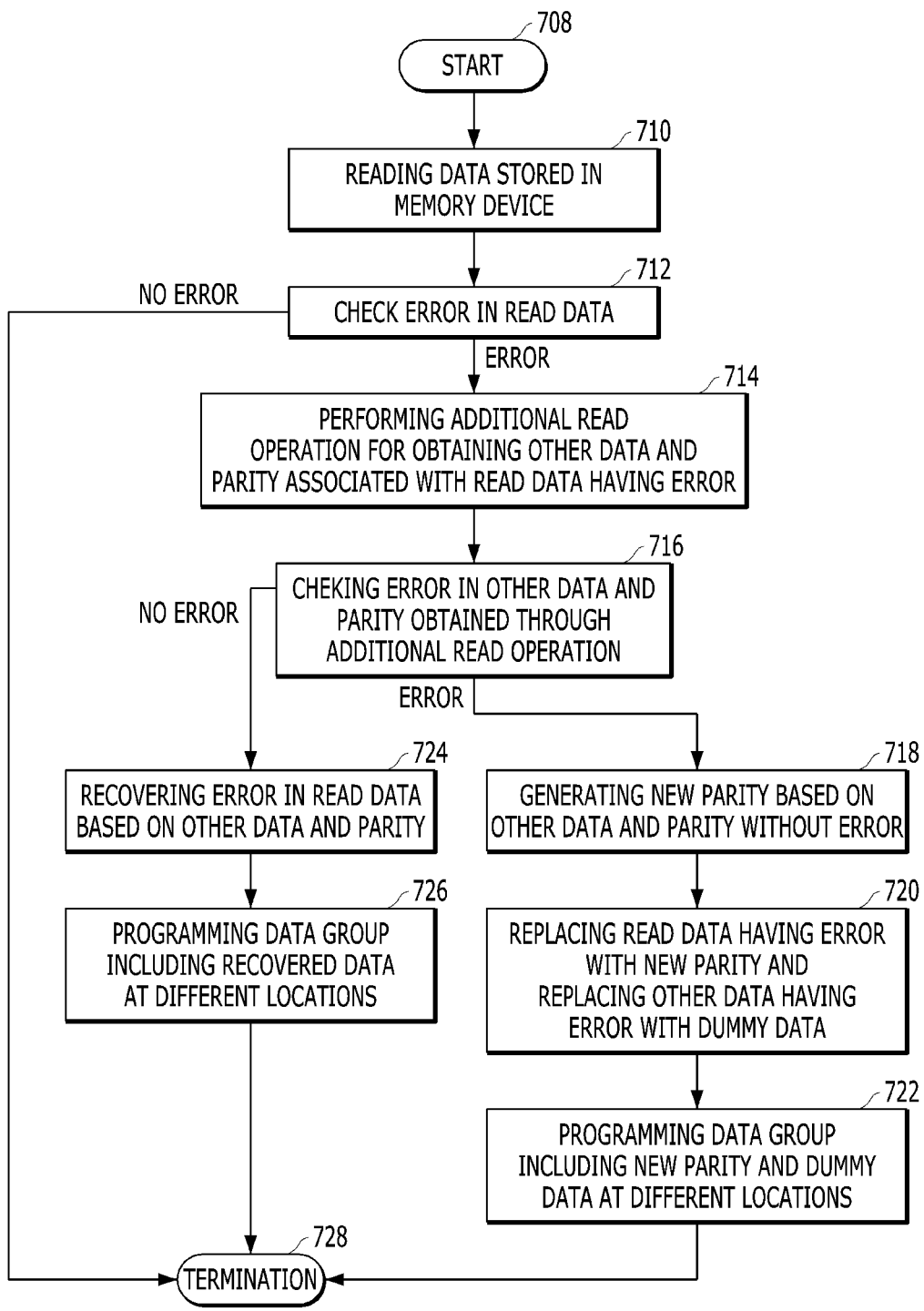
FIG. 8 illustrates a method for operating the memory system according to an embodiment of the present disclosure.

FIG. 8 illustrates a method for operating the memory system according to an embodiment of the present disclosure.

Referring to FIG. 8, the method for operating the memory system 110 can include starting a read operation (operation 708). The read operation corresponds to a read command input from an external device such as the host 102. Receiving the read command, the memory system 110 may determine to perform the read operation. Also, even if there is no read command input from the external device, the memory system 110 can determine to perform a read operation for garbage collection, wear leveling, read retry, or the like.

When it is determined to perform a read operation, the memory system 110 may read data items stored in the memory device 150 (operation 710). Referring to FIGS. 6 to 7, the memory system 110 can program the data group in the page group P_Grp_0, P_Grp_1 in the memory device 150 together, but a read operation for reading a data item stored in the memory device 150 can be performed on a page basis. The controller 130 can use a physical address to determine a read data items range through a read operation among plural data items stored in the memory device 150.

The memory system 110 can check whether an error is included in the data item read and delivered from the memory device 150 (operation 712). Herein, the error can include an uncorrectable ECC error (UECC).

When there is no error (NO ERROR in the operation 712), the memory system 110 can terminate the read operation (operation 728). For example, because there is no error in the data item, the memory system 110 can output the data item secured through a read operation to the external device or may program the data item in another location of the memory device 150 for the garbage collection.

When the data item includes the error (ERROR in the operation 712), the memory system 110 can perform an additional read operation regarding additional data items and a parity associated with the data item in which the error occurs (operation 714). When the memory system 110 reads the data item stored in at least one page through a read operation (operation 710) and the data item includes the error, the memory system 110 can secure the additional data items and the parity associated with the data item including the error to recover or restore the data item from the error. Herein, the additional data items and the parity can be determined based on the parity calculation described with reference to FIG. 7. For example, when the first data item D0 stored in the first page group P_Grp_0 includes an error, the first parity Parity0 and other data items D4, D8, D12, D48, D52, D56, D60, D96, D100, D104, D108, D144, D148, D152 associated with the first data item D0 can be read through the additional read operation.

According to an embodiment, the additional data and the parity can be included in the data group stored in the page group P_Grp_0, P_Grp_1 to which the data item in which the error has occurred belongs. For example, when the first data item D0 stored in the first page group P_Grp_0 includes an error, the memory system 110 can secure other data items D1 to D187 and the parities Parity0 to Parity11 stored in the first page group P_Grp_0 through the additional read operation.

The memory system 110 may check whether an error is included in data obtained through an additional read operation (operation 716). Here, the error may include an uncorrectable ECC error (UECC).

When there is no error in the data items obtained through the additional read operation (NO ERROR in the operation 716), the memory system 110 can use the additional data items and the parity to recover the data item including the error (operation 724). Referring to FIG. 7, the parity can be generated by performing an exclusive OR (XOR) operation on plural data items. When an error is included in the first data item D0 stored in the first page group P_Grp_0, the first data item D0 can be restored or recovered by an exclusive OR (XOR) operation on the first parity Parity0 and other data items D4, D8, D12, D48, D52, D56, D60, D96, D100, D104, D108, D144, D148, D152 which are used to determine the first parity Parity0.

The memory system 110 may program the data group including the recovered data at new locations (operation 726). For example, the memory system 110 can determine that another error can occur again in the first memory block Block0 in which the first data item D0 including the error has been stored. Accordingly, the memory system 110 can program all data items stored in the first memory block Block0 included in the first page group P_Grp_0 in different locations (e.g., a different memory block or a free block) for enhancing data safety.

When there is an error in other data items and the parity obtained through the additional read operation (ERROR in the operation 716), the memory system 110 can generate a new parity based on the additional data items and the parity without the error (operation 718). When an error occurs in a data item secured through the read operation, an additional read operation is performed, and another error occurs in other data items and the parity secured through the additional read operation, it is difficult to use the parity to recover the data item including the error. When errors occur in at least two data items among the plural data items, a stored parity might be no longer useful. Accordingly, the memory system 110 can calculate a new parity based on error-free data items among the plural data items. For example, if the first data item D0 stored in the first page group P_Grp_0 contains an error, an additional read operation is performed. Additional data items D4, D8, D12, D48, D52, D56, D60, D96, D100, D104, D108, D144, D148, D152 and the first parity Parity0 can be secured through the additional read operation, but a fifth data item D4 can have an error. If the errors are included in two data items D0, D4 among 15 data items used to calculate the first parity Parity0, the first parity 0 might not be useful for 13 other data items D8, D12, For D48, D52, D56, D60, D96, D100, D104, D108, D144, D148, D152. Accordingly, the memory system 110 performs an exclusive-OR (XOR) based on the 13 other data items (D8, D12, D48, D52, D56, D60, D96, D100, D104, D108, D144, D148, D152) to generate a new parity.

The memory system 110 can replace an error included in the read data items with the new parity and replace another error included in the additional data item with dummy data (operation 720). For example, the first data item D0 can be replaced with the new parity, and the fifth data item D4 can be replaced with the dummy data.

The memory system 110 can program a data group replaced with the new parity and the dummy data at new locations (operation 722). For example, the errors occur in the first data item D0 and the fifth data item D4, and the first data item D0 and the fifth data item D4 are stored in the first memory block Block0 and the second memory block Block1. The memory system 110 can estimate or determine that another error might occur in the first memory block Block0 and the second memory block Block1. The memory system 110 can replace some of the data group stored in the first memory block Block0 and the second memory block Block1 included in the first page group P_Grp_0 with the new parity and the dummy data, and store replaced data group at different locations (e.g., new memory blocks or free memory blocks). In addition, since the memory system 110 calculates and stores a new parity, the memory system 110 can unmap the first parity Parity0 because the first parity Parity0 is no longer useful.

Figure 9:
FIG. 9 illustrates how to operate the memory system when a single error occurs in the data group according to embodiments of the present disclosure.

FIG. 9 illustrates how to operate the memory system when a single error occurs in the data group according to an embodiment of the present disclosure. In FIG. 9, for convenience of description, LSB(L) data items LPD0 to LPD59 among the first page group P_Grp_0 will be described as an example.

Referring to FIG. 9, an error can occur in one of a plurality of LSB(L) data items LPD0 to LPD59 and corresponding LSB parities LPDP0 to LPDP3 in the first page group P_Grp_0. When the error occurs in a 37th LSB data item LPD36, the memory system 110 can use the first LSB parity LPDP0 to recover the 37th LSB data LPD36. That is, if there is no error in the first LSB parity LPDP0 and the other 14 LSB data items LPD0, LPD4, LPD8, LPD12, LPD16, LPD20, LPD24, LPD28, LPD32, LPD40, LPD44, LPD48, LPD52, LPD56, the memory system 110 can perform an exclusive OR (XOR) operation to recover or restore the 37th LSB data LPD36.

FIG. 10 illustrates a data recovery operation in a situation shown in FIG. 9 according to an embodiment of the present disclosure.

Referring to FIG. 10, the memory system 110 can recover the 37th LSB data LPD36 based on the data items and the parity, in which no error occurs, and include the 37th recovered LSB data R_LPD36 in the data group. Thereafter, the memory system 110 can determine that another error can occur in the second memory block Block1 in which the 37th LSB data LPD36 has been stored. The memory system 110 can program all data items stored in the second memory block Block1 included in the first page group P_Grp_0 including the 37th recovery LSB data R_LPD36 in different locations such as a 1002nd memory block Block1001.

Referring to FIG. 10, the memory system 110 can migrate the data group including the recovered data item from the second memory block Block1 to the 1002nd memory block Block1001 in the same plane P1 of the same die D0. According to an embodiment, the memory device 110 can program the data group to another memory block included in another die or plane. After programming or migrating the data group including the recovered data item, the memory system 110 can update map data or a map table regarding the migrated or programmed data group.

FIG. 11 illustrates how to operate the memory system when plural errors occur in the data group according to an embodiment of the present disclosure. In FIG. 11, for convenience of description, LSB (L) data items LPD0 to LPD59 in the first page group P_Grp_0 will be described as an example.

Referring to FIG. 11, two errors may occur in the plural LSB(L) data items LPD0 to LPD59 and corresponding LSB parities LPDP0 to LPDP3 among the first page group P_Grp_0. Specifically, the two errors occur in a ninth LSB data item LPD8 and a 37th LSB data item LPD36, and both the ninth LSB data item LPD8 and the 37th LSB data item LPD36 are associated with the first LSB parity LPDP0. Accordingly, the memory system 110 can try to use the first LSB parity LPDP0 to recover the ninth LSB data item LPD8 and the 37th LSB data item LPD36, but the ninth LSB data item LPD8 and the 37th LSB data item LPD36 might not be recovered. That is, even if there is no error in the first LSB parity LPDP0 and the other 13 LSB data items LPD0, LPD4, LPD12, LPD16, LPD20, LPD24, LPD28, LPD32, LPD40, LPD44, LPD48, LPD52, LPD56, it is difficult to recover the ninth LSB data item LPD8 and the 37th LSB data item LPD36 by an exclusive-OR (XOR) operation performed by the memory system 110.

FIG. 12 illustrates a data recovery operation in a situation shown in FIG. 11 according to an embodiment of the present disclosure.

Referring to FIG. 12, the memory system 110 might not recover the ninth LSB data item LPD8 and the 37th LSB data item LPD36, but can generate a new parity NP0 based on the data items and the parity in which no error occurs. The memory system 110 may replace the 37th LSB data item LPD36 with the new parity NP0 and replace the ninth LSB data item LPD8 with dummy data item DDB. The memory system 110 can estimate or determine that another error may occur later in the third memory block Block2 and the second memory block Block1 in which the ninth data item LPD8 and the 37th LSB data item LPD36 have been stored. Accordingly, the memory system 110 can migrate the data group replaced with the new parity NP0 and the dummy data item DD8 to a new memory block Block1001. The memory system 110 can program all of the data group, which has been stored in the third memory block Block2 and the second memory block Block1 included in the first page group P_Grp_0 and is replaced with the new parity NP0 and the dummy data item DD8, into a 1002nd memory block Block1001 and a 1003rd memory block Block1002, which are different locations within the same plane or the same die.

Referring to FIG. 12, the memory system 110 can migrate a replaced data group from the second memory block Block1 and the third memory block Block2 to the 1002nd memory block Block1001 and the 1003rd memory block Block1002 which are other memory blocks in the same planes P1 and P2 of the same die D0. According to an embodiment, the memory device 110 can migrate or move data to a memory block included in another die or another plane. After migrating or moving data, the memory system 110 may update map data for the migrated or moved data.

In addition, because the errors occur in the ninth LSB data item LPD8 and the 37th LSB data item LPD36 among 15 LSB data items used to calculate the first LSB parity LPDP0, the first LSB parity LPDP0 might be no longer used. Further, because the new parity NP0 for the 13 LSB data items without an error is generated, the memory system 110 can unmap the first LSB parity LPDP0.

FIG. 13 illustrates a change in a remap table storing a data recovery operation according to an embodiment of the present disclosure.

Referring to FIG. 13, the memory system 110 changes a table for managing a remap performed according to migration or movement of a data group to improve efficiency of management and control of the memory device 150.

For example, data items stored in the first memory block Block0 are migrated or moved to the 1002nd memory block Block1001, and then the map data is updated. In a memory system, the table might only record whether a remap is performed. The remap information can indicate that the 1002nd memory block Block1001 becomes the first memory block Block0 of the first memory die D0 (i.e., all data items stored in the first memory block Block0 are moved into the 1002nd memory block Block1001).

The remap table used in the memory system 110 according to an embodiment of the present disclosure can include additional data or information. For example, the remap table can include a chipkill parity field (C-Parity) indicating whether or not a new parity is calculated and included in a data group, a page group field (P-Group) indicating which page group the data group is migrated or moved from, an index indicating where the new parity is recorded in the page group, and a dummy data field (E-List[0:3]/P) indicating a position of dummy data item which is not used for calculating the new parity included in the data group. The remap table can include plural dummy data fields (E-List[0:3]/P) because the data group can include plural dummy data items. According to an embodiment, the number of dummy data fields in the remap table can be set based on acceptable or tolerable errors in each data group.

For example, two errors occur in a data group. The positions of a ninth LSB data item LPD8 and a 37th LSB data item LPD36 described with reference to FIGS. 11 to 12 can correspond to the positions of a ninth data item D8 and a 101st data item D100 described with reference to FIG. 6. The memory system 110 replaces the 37th LSB data item LPD36 with the new parity NP0, replaces the ninth LSB data LPD8 with dummy data item, and then migrates replaced data group into the 1002nd memory block Block1001. Accordingly, data items of the first page group P_Grp_0 in the second memory block Block1 of the first die D0 can be moved or migrated to the 1002nd memory block Block1001, and the 37th LSB data item LPD36 can be replaced with a new parity NP0. The new parity NP0 can be programmed as a 101st data item D100 corresponding to a migrated location of the 37th LSB data item LPD36. This state can be recorded in the remap table as follows: the chip-kill parity field (C-Parity) is '1' (indicating that there is a new parity); the page group field (P-Group) is '0' (indicating the first page group P_Grp_0); the index (Index) is '100' (indicating the 101st data item D100); and the dummy data field '8' (indicating the ninth data item D8) may be recorded in (E-List[0:3]/P).

Based on the data or information included in the remap table, the memory system 110 can easily recognize and determine whether the new parity is included, where the new parity is located, where the dummy data item is located, and the like. Through this remap table, the memory system 110 can check whether an error newly occurs among plural data items without an error in a next read operation. In addition, such a remap table could reduce or avoid unnecessary read operations in a process of the memory system 110 recovering a data item in which an error has occurred.

As above described, a memory system according to an embodiment of the present disclosure can perform a data program operation in a non-volatile memory device in a unit of a data group including plural data items and at least one parity generated based on the plural data items and perform a different recovery operation according to the number of errors occurring within a data group, thereby improving operational efficiency of the recovery operation and enhancing safety and reliability of data stored in the memory system.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, control circuitry, devices, modules, units, multiplexers, logic, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, control circuitry, devices, modules, units, multiplexers, logic, interfaces, decoders, drivers, generators and other signal generating and signal processing features may be, for example, any of a variety of integrated circuits including but not limited to an application-specific integrated circuit, a field-programmable gate array, a combination of logic gates, a system-on-chip, a microprocessor, or another type of processing or control circuit.

When implemented at least partially in software, the controllers, processors, control circuitry, devices, modules, units, multiplexers, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

While the present teachings have been illustrated and described with respect to specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A memory system comprising:
   a memory device including plural memory blocks; and
   a controller coupled to the memory device and configured to:
   control the memory device to read a first group including plural data items and a parity associated with the plural data items from first locations in the plural memory blocks,
   generate a new parity when the plural data items and the parity associated with the plural data items include plural errors,
   substitute one of the plural errors with the new parity and another of the plural errors with dummy data, and
   control the memory device to program a second group including the new parity and the dummy data in second locations in the plural memory blocks,
   wherein the second locations are different from the first locations.

2. The memory system according to claim 1, wherein the controller is configured to:
   control the memory device to read the first group;
   receive first read data items included in the first group from the memory device for a first read operation; and
   check whether the first read data items include an uncorrectable ECC (UECC) error.

3. The memory system according to claim 2, wherein the controller is further configured to:
   receive the plural data items excluding the first read data items and the parity associated with the plural data items from the memory device for a second read operation when the first read data items include the uncorrectable ECC (UECC) error, and
   check whether the plural data items excluding the first read data items and the parity associated with the plural data items include another uncorrectable ECC (UECC) error.

4. The memory system according to claim 3,
   wherein the controller generates, when at least two among the plural data items and the parity included in the first group include the uncorrectable ECC (UECC) errors, the new parity based on the plural data items without the uncorrectable ECC (UECC) errors included in the first group, and
   wherein the controller substitutes one of the at least two with the new parity and another of the at least two with dummy data.

5. The memory system according to claim 3, wherein the controller is further configured to recover, when the plural data items excluding the first read data items and the parity obtained through the second read operation include no uncorrectable ECC (UECC) error, the first read data items based on the plural data items excluding the first read data items and the parity associated with the plural data items.

6. The memory system according to claim 1, wherein the controller is further configured to unmap, when the parity associated with the plural data items includes an uncorrectable ECC (UECC) error, the parity from the first group.

7. The memory system according to claim 1, wherein the first locations and the second locations are included in different memory blocks.

8. The memory system according to claim 1, wherein the second locations are selected from a free memory block included in the memory device.

9. The memory system according to claim 1, wherein the first group includes 15 data items and a single parity associated with the 15 data items, and the 15 data items and the single parity are distributed over, and stored in, the plural memory blocks.

10. The memory system according to claim 9, wherein the single parity is calculated by an exclusive OR (XOR) operation to the 15 data items.

11. The memory system according to claim 10, wherein the controller controls the memory device to read the first group for a garbage collection operation, a wear levelling operation, or a read retry operation.

12. A method for operating a memory system, the method comprising:
   controlling a memory device including plural memory blocks to read a first group including plural data items and a parity associated with the plural data items from first locations in the plural memory blocks;
   generating a new parity when the plural data items and the parity include plural errors;
   substituting one of the plural errors with the new parity and another of the plural errors with dummy data; and
   controlling the memory device to program a second group including the new parity and the dummy data in second locations in the plural memory blocks,
   wherein the second locations are different from the first locations.

13. The method according to claim 12, wherein the controlling the memory device to read the first group comprises:
   receiving first read data items included in the first group from the memory device for a first read operation; and
   checking whether the first read data items include an uncorrectable ECC (UECC) error.

14. The method according to claim 13, wherein the controlling the memory device to read the first group further comprises:
   receiving the plural data items excluding the first read data items and the parity associated with the plural data items from the memory device for a second read operation; and
   checking whether the plural data items excluding the first read data items and the parity include another uncorrectable ECC (UECC) error.

15. The method according to claim 14,
   wherein the new parity is generated, when at least two of the plural data items and the parity included in the first group include the uncorrectable ECC (UECC) errors, based on the plural data items without the uncorrectable ECC (UECC) errors included in the first group, and
   wherein one of the at least two is substituted with the new parity and another of the at least two is substituted with dummy data.

16. The method according to claim 14, further comprising recovering the first read data items based on the plural data items excluding the first read data items and the parity associated with the plural data items when the plural data items excluding the first read data items and the parity obtained through the second read operation include no uncorrectable ECC (UECC) error.

17. The method according to claim 12, further comprising unmapping the parity associated with the plural data items from the first group when the parity includes an uncorrectable ECC (UECC) error.

18. The method according to claim 12,
wherein the first group includes 15 data items and a single parity associated with the 15 data items, and the 15 data items and the single parity are distributed over, and stored in, the plural memory blocks, and
wherein the single parity is calculated by an exclusive OR (XOR) operation to the 15 data items.

19. A memory system comprising:
a memory device including plural memory blocks; and
a controller configured to:
perform a read operation by
controlling the memory device to read first read data items,
receiving the first read data items from the memory device, and
checking whether the first read data items include an uncorrectable ECC (UECC) error;
perform, when the first read data items include the UECC error, an additional read operation by
controlling the memory device to read plural data items and a parity associated with the first read data items,
receiving the plural data items and the parity from the memory device, and
checking whether one of the plural data items and the parity associated with the first read data items includes another UECC error;
generate a new parity when at least one of the plural data items and the parity includes the another UECC error;
substitute the UECC error included in the first read data items with the new parity and the another UECC error included in the plural data items and the parity with dummy data; and
control the memory device to program the first read data items and the plural data items including the new parity and the dummy data in the plural memory blocks.

20. The memory system according to claim 19, wherein the controller is further configured to recover the first read data items when the plural data items and the parity associated with the first read data items do not include an UECC error.

* * * * *